(12) United States Patent
Myers et al.

(10) Patent No.: US 8,330,478 B2
(45) Date of Patent: Dec. 11, 2012

(54) OPERATING PARAMETER MONITORING CIRCUIT AND METHOD

(75) Inventors: James Edward Myers, Cambridge (GB); David Walter Flynn, Cambridge (GB); Sachin Satish Idgunji, San Jose, CA (US); Gregory Munson Yeric, Austin, TX (US)

(73) Assignee: ARM Limited, Cambridge (GB)

( * ) Notice: Subject to any disclaimer, the term of this patent is extended or adjusted under 35 U.S.C. 154(b) by 504 days.

(21) Appl. No.: 12/588,963

(22) Filed: Nov. 3, 2009

(65) Prior Publication Data

US 2011/0101998 A1 May 5, 2011

(51) Int. Cl.
*G01R 31/3187* (2006.01)
*G01R 31/26* (2006.01)

(52) U.S. Cl. ............ 324/750.3; 324/762.01; 324/762.09

(58) Field of Classification Search .. 324/750.01–750.3, 324/762.01–762.1; 331/57, 175, 143, 34, 331/65, 177 R; 327/142, 512
See application file for complete search history.

(56) References Cited

U.S. PATENT DOCUMENTS

| | | | |
|---|---|---|---|
| 5,410,278 A * | 4/1995 | Itoh et al. | 331/57 |
| 6,104,256 A | 8/2000 | Boudewijns | |
| 6,731,558 B2 | 5/2004 | Yamauchi et al. | |
| 6,882,172 B1 | 4/2005 | Suzuki et al. | |
| 6,995,621 B1 * | 2/2006 | Culler | 331/57 |
| 7,235,998 B1 | 6/2007 | Suzuki | |
| 7,265,639 B2 * | 9/2007 | Bhushan et al. | 331/57 |
| 2004/0263192 A1 | 12/2004 | Persun et al. | |
| 2007/0132523 A1 | 6/2007 | Newman | |
| 2009/0096495 A1 | 4/2009 | Keigo | |

FOREIGN PATENT DOCUMENTS

JP 55-70128 5/1980

OTHER PUBLICATIONS

UK Search Report dated Jan. 11, 2011 for GB 1014647.0.
U.S. Appl. No. 12/588,961, filed Nov. 3, 2009, Yeric et al.
Office Action mailed Jun. 8, 2011 in co-pending U.S. Appl. No. 12/588,961.

* cited by examiner

*Primary Examiner* — Tung X Nguyen
(74) *Attorney, Agent, or Firm* — Nixon & Vanderhye P.C.

(57) ABSTRACT

A monitoring circuit 14, 16, 18, 20, 22 for monitoring an operating parameter of an integrated circuit 2 comprises a ring oscillator circuit 80 comprising a plurality of serially connected inverting stages 82-1, 82-2, 82-3. At least one of the inverting stages 82-1, 82-2 comprises at least one leakage transistor 64-1, 64-2 which is configured to operate in a leakage mode in which substantially all current through the at least one leakage transistor is a leakage current, and a capacitive element 70-1 arranged to be charged or discharged in dependence on the leakage current. The ring oscillator circuit 80 thus generates an oscillating signal with an oscillation period dependent on a rate at which the capacitive element 70-1 is charged or discharged. The operating parameter controls a magnitude of the leakage current so that the oscillation period indicates the operating parameter.

27 Claims, 18 Drawing Sheets n-type leakage based embodiment (Inverter embodiment)

Transmission gate embodiment

OPERATING PARAMETER MONITORING CIRCUIT AND METHOD

BACKGROUND OF THE INVENTION

1. Field of the Invention

The present invention relates to the field of integrated circuits. More particularly, this invention relates to monitoring an operating parameter within an integrated circuit.

2. Description of the Prior Art

It is known to provide an integrated circuit with one or more monitoring circuits which seek to provide monitoring information regarding operating parameters of the integrated circuit. A typical operating parameter to be monitored is operating temperature. Other operating parameters which may be monitored include an operating voltage. This information can be used to ensure correct operation of the integrated circuit and may, in some circumstances, be used to adjust the operation using a feedback mechanism.

It is known to provide ring oscillator circuits in which the oscillation frequency gives an indication of the operating temperature of an integrated circuit. As the integrated circuit heats up, the transistors making up the inverter chain within the ring oscillator will operate more rapidly and accordingly the oscillation frequency will increase. A problem with such mechanisms is that the relationship between oscillation frequency and temperature can be complex and the ring oscillator may require relatively complicated biasing circuits and/or analogue outputs. Also, to obtain a low enough frequency to be measurable a ring oscillator needs to comprise a relatively large number of gates.

As process geometries diminish in size, local variation of basic MOSFET characteristics become so large that simple chip-level guard-banded designs become heavily over designed and inefficient. In addition, key systematic effects, such as implant shadowing or stress engineering effects multiply the number of permutations of MOSFET implementations that should be monitored. Owing to such effects, MOSFET characteristics have become location and context-specific. Accordingly, relying on a simple set of boundary-provided wafer acceptance test MOSFET parameters will be less accurate than system-on-chip embedded MOSFET monitors due to context-dependent effects and local variations that cannot be monitored from the distant areas where wafer monitors are provided. Accordingly, there is a need for a small and low-power monitoring circuit for embedded MOSFET monitoring as well as silicon acceptance testing, performance binning and adaptive circuits.

SUMMARY OF THE INVENTION

Viewed from one aspect, the present invention provides a monitoring circuit for monitoring an operating parameter of an integrated circuit, said monitoring circuit comprising:

a ring oscillator circuit configured to generate an oscillating signal, said ring oscillator circuit comprising a plurality of serially connected inverting stages;

wherein at least one of said inverting stages comprises:

(a) at least one leakage transistor configured to operate in a leakage mode in which substantially all current through said at least one leakage transistor is a leakage current; and (b) a capacitive element configured to be charged or discharged in dependence on said leakage current, an oscillation period of said oscillating signal being dependent on a rate at which said capacitive element is charged or discharged; and said operating parameter controls a magnitude of said leakage current such that said oscillation period is indicative of said operating parameter.

The ring oscillator has at least one inverting stage comprising at least one leakage transistor operable in a leakage mode and a capacitive element arranged to be charged or discharged in dependence on a leakage current through the at least one leakage transistor. The leakage current through the at least one leakage transistor has a predictable variation with a number of operating parameters which can be monitored with the monitoring circuit. As the leakage current varies with the operating parameter, the rate at which the capacitive element is charged or discharged varies accordingly. This means that the rate at which the oscillating signal propagates through the ring oscillator circuit is dependent on the operating parameter and hence the oscillation period is an indicator of the operating parameter. Operating the ring oscillator in this way provides a small, low cost, and low power monitoring circuit whilst providing the ability to monitor a variety of parameters of the integrated circuit.

Unlike traditional ring oscillators, which are large to ensure that the oscillation period is long enough to be measurable, the ring oscillator of the monitoring circuit of the present technique can be made small because the capacitive element takes a finite time to be charged or discharged and so this delays the propagation of the oscillating signal through the ring oscillator, thus increasing the oscillation period to a measurable range. Thus, the overall size and power consumption of the monitoring circuit is reduced, which enables the provision of multiple monitoring circuits at various locations on the integrated circuit. By providing multiple monitoring circuits on a single integrated circuit, the local variation of MOSFET characteristics can be monitored.

In the present technique, at least one inverting stage has at least one leakage transistor and the capacitive element. It is possible that a plurality, or all, of the inverting stages of the ring oscillator comprise the leakage transistor(s) and capacitive element.

While the capacitive element could be a capacitor, this is not essential as circuit elements of the monitoring circuit will themselves have an appreciable capacitance and so can serve as the capacitive element. For example, a metal-on-silicon interface of a transistor can act as the capacitive element.

Also, since the at least one leakage transistor for charging the capacitive element can be implemented using either a single transistor or multiple transistors, any references to a single "leakage transistor" should be taken to also include the equivalent embodiment where a plurality of leakage transistors are provided, each being operable in a leakage mode where substantially all current through the leakage transistor is leakage current.

In an embodiment, the operating parameter is an operating temperature of the at least one leakage transistor. The leakage current is temperature dependent and so the oscillation period of the oscillating signal of the ring oscillator will be dependent on the operating temperature of the leakage transistor. By locating the monitoring circuit on the integrated circuit, the operating temperature of the leakage transistor may be well correlated with the operating temperature of the surrounding portions of the integrated circuit, and so the monitoring circuit can give an indication of the temperature of those surrounding portions.

The operating parameter may also be a supply voltage supplied to the least one leakage transistor. The leakage current is dependent on the voltage supplied to the leakage transistor (for example, the gate voltage or source voltage applied to the leakage transistor). This means that at a given temperature the oscillation period of the ring oscillator can indicate the voltage level applied to the leakage transistor.

Other operating parameters that could be measured include an amplitude of the leakage current itself at a particular temperature or gate voltage, and a threshold supply voltage (e.g. gate or source voltage) at which the leakage current becomes substantially zero. It is often desirable to reduce the amount of power consumed by an integrated circuit. Reducing leakage currents will help to reduce the power consumption. Leakage current tends towards zero as a gate-source voltage difference tends towards a threshold value. Therefore, it can be useful to be able to determine at what voltage the leakage current becomes zero. By operating at that threshold voltage, power consumption can be reduced.

In an embodiment, the at least one leakage transistor comprises at least one p-type transistor coupled between a supply voltage and the capacitive element, and the capacitive element is charged in dependence on the leakage current through the at least one p-type transistor. In this embodiment, when the p-type transistor is placed in the leakage mode, then substantially all the current through the p-type transistor is a leakage current which slowly charges the capacitive element. The rate at which the capacitive element is charged determines the oscillation period of the ring oscillator.

While it is possible to provide a variable gate voltage to the at least one p-type leakage transistor (thus allowing the p-type leakage transistor to be selectively placed in the leakage mode or brought out of the leakage mode), in an embodiment the at least one p-type transistor has its gate coupled to the supply voltage. This means that the p-type transistor is placed permanently in the leakage mode and so will always pass a leakage current. As the voltage supplied to the leakage transistor is held constant, then temperature will be the main factor determining the magnitude of leakage current, and so this arrangement provides a simple circuit for measuring temperature as the operating parameter.

The at least one inverting stage may also comprise at least one pull-down transistor for discharging the capacitive element. Thus, the oscillating signal is generated through a cycle of charging the capacitive element with the leakage through the p-type transistor and discharging the capacitive element with the pull-down transistor.

In another embodiment, the at least one leakage transistor may comprise at least one n-type transistor coupled between a ground voltage and the capacitive element, and the capacitive element is discharged in dependence on the leakage current through the at least one n-type transistor. It is thus possible to provide an NFET leakage-based monitoring circuit. As the leakage current leaks through the n-type transistor the capacitive element is discharged at a rate dependent on the operating parameter. It is useful to provide the NFET leakage-based sensor in addition or instead of the PFET leakage-based sensor because the leakage mechanism in n- and p-type transistors behaves differently and so on occasion a monitoring circuit comprising either an n- or p-type leakage transistor may be preferred over the other type. For example, if the monitoring circuit is being placed in a region of an integrated circuit having more transistors of one charge carrier type than the other, then a monitoring circuit with a leakage transistor of the dominant type can be selected.

The at least one n-type transistor may have its gate coupled to the ground voltage. This means that the n-type transistor is placed in the leakage mode permanently so that substantially the only current through the n-type transistor is the leakage current. This avoids variation in gate voltage supplied to the n-type transistor and so enables temperature measurements to be made with a simple circuit.

The at least one inverting stage may also comprise at least one pull-up transistor for charging the capacitive element. The oscillating signal will then be caused by alternately discharging the capacitive element with the leakage through the at least one n-type leakage transistor and charging the capacitive element with the pull-up transistor.

The at least one inverting stage may also comprise a buffer configured to output an oscillating signal value to a following inverting stage, and the buffer may be configured to switch the oscillating signal value between a high value and a low value when the capacitive element is charged or discharged beyond a threshold charge level. This is useful because the buffer prevents the oscillating signal value being set to an intermediate value when the capacitive element is partially charged or discharged. This ensures that a transistor downstream from the buffer is turned fully on or fully off, thus avoiding metastability in the oscillating signal.

The provision of the buffer is also useful because at least part of the capacitive element may be formed by part of the buffer. This means that the capacitive element does not need to be a capacitor per se, but can be formed by part of the buffer already provided to output the oscillating signal value. This helps to keep the circuit area and gate count low. For example, a metal-on-silicon interface in one of the gates of the buffer has a certain amount of capacitance and so can form the capacitive element. Conductive wires in the buffer may also have some capacitance. The capacitive element can also be formed by part of the buffer in combination with other elements of the inverting stage.

In an embodiment, the at least one inverting stage comprises an inverter configured to output an oscillating signal value to a following inverting stage, and the inverter may be configured to switch the oscillating signal value between a high value and a low value when the capacitive element is charged or discharged beyond a threshold charge level. As in the embodiment comprising the buffer, the inverter ensures that the oscillating signal provided to the following inverting stage is set to either a high value or a low value, not an intermediate value. However, unlike the buffer, the inverter also inverts the signal value as it is output to the next stage. This is advantageous as at some points in the circuit, this can enable the relative timings of the signals propagating through the ring oscillator to be measured more easily because the width of some signal pulses is increased.

At least part of the capacitive element may be formed by a part of the inverter. As for the buffer, this may be formed, for example, by a metal-on-silicon interface in a transistor, or of a wire forming part of the inverter. The capacitive element may also comprise multiple elements, some in the inverter and some in the rest of the inverting stage.

The oscillation period of the oscillating signal propagating through the ring oscillator circuit should be in a measurable range. If the capacitive element does not have sufficient capacitance to provide a measurable oscillation period (for example, if the leakage through the leakage transistor is particularly high or if fast switching transistors are used), then a delaying element can be provided to increase the oscillation period to a measurable range. The delaying element delays propagation of the oscillating signal through the at least one inverting stage. This means that a counter of lower resolution can be used to measure the oscillation period, and so the power consumption at the counter can be reduced.

In an embodiment, the capacitive element may comprise:
a principal capacitive portion;
at least one additional capacitive portion; and
at least one transmission gate, each transmission gate configured to selectively place a respective additional capacitive portion in an active mode in which said leakage current charges or discharges said respective additional capacitive portion;

wherein a capacitance of said capacitive element is dependent on a number of said at least one additional capacitive portion currently placed in said active mode.

In such an embodiment, a capacitive element with a variable capacitance may be provided to enable adjustments to the range of the oscillation period. The capacitance can be varied by selectively switching into the signal path respective additional capacitive portions, to supplement the capacitance provided by a principal capacitive portion. By switching a corresponding transmission gate, each additional capacitive portion can individually be placed in an active state in which the leakage current charges or discharges the additional capacitive portion. When one or more additional capacitive portions are in the active state, less charge is accumulated in, or dissipated from, the principal capacitive portion, and so the principal capacitive portion is charged or discharged more slowly than when no additional capacitive portions are in the active state. Thus, the principal capacitive element takes longer to be charged or discharged beyond the threshold level for triggering switching of the stage output signal, and so the oscillation period becomes longer. Thus, by switching individual capacitive portions in and out of the active state, the length of the oscillation period can be varied. This could be used to adjust the magnitude of the oscillation period so that it can be measured with a counter of a given counter resolution. Also, some charge-time tuning can be made to account for fast or slow integrated circuits and bring the delay of those circuits in line with more typical circuits.

In one embodiment, the capacitive element may comprise:

a first capacitive element configured to be charged or discharged in dependence on said leakage current; and a second capacitive element configured to be charged or discharged in dependence on an additional leakage current once said first capacitive element has been charged or discharged beyond a threshold charge level; wherein:

said oscillation period is dependent on a rate at which said first capacitive element is charged or discharged and a rate at which said second capacitive element is charged or discharged; and said operating parameter controls a magnitude of said leakage current and a magnitude of said additional leakage current such that said oscillation period is indicative of said operating parameter.

The first and second capacitive elements are configured so that when the first capacitive element is charged or discharged beyond a threshold charge level, the second capacitive element begins to be charged or discharged. The oscillation period is dependent on the total time for charging or discharging both the first and second capacitive elements beyond a respective threshold level. This means that the overall time for signals propagated through the inverting stage is longer and so the oscillation period can be increased to a measurable level. It will be appreciated that more then two capacitive elements could be arranged in this way so that each successive capacitive element begins to be charged or discharged when a previous capacitive element has reached a predetermined threshold charge level. The more capacitive elements that are arranged in series, the longer the propagation delay and so the greater the oscillation period.

In one example, the first capacitive element is charged in dependence on the leakage current, while the second capacitive element is discharged in dependence on the additional leakage current. In this configuration, a relatively simple circuit can provide a measurable oscillation period.

The first capacitive element may comprise a gate interface of a gating transistor, and the gating transistor may be configured to allow the second capacitive element to be charged or discharged once the gate interface has been charged or discharged beyond the threshold charge level. In this example, once the gate interface has been charged or discharged beyond the threshold charge level then the gating transistor is switched on or off, thus triggering the start of charging or discharging of the second capacitive element. Thus, the gating transistor ensures that the second capacitive element does not begin charging or discharging until the first capacitive element has reached the threshold charge level.

The second capacitive element may comprise at least one inverter. The inverter has a certain amount of capacitance associated with it. The more inverters that are used to form the second capacitive element, the greater the capacitance of the second capacitive element and hence the greater the time taken to charge the second capacitive element as a whole.

The monitoring circuit may comprise measuring circuitry for measuring the oscillation period of the oscillating signal. Thus, the measured oscillation period can be used to calculate an operating parameter of the integrated circuit.

Alternatively, the oscillating signal could be output from the monitoring circuit for analysis by an external measuring circuit. For example, a processor of the integrated circuit being monitored could measure the oscillation period of the oscillating signal.

The circuit may also comprise calibrating circuitry for performing a calibration to enable correlation of a measured oscillation period value with an operating parameter value. While a non-calibrated measuring circuitry can give a relative indication of the operating parameter (i.e. whether the operating parameter at a first time is greater or smaller than the operating parameter at a second time), calibration is required in order to provide an absolute value of an operating parameter.

Viewed from another aspect, the present invention provides an integrated circuit comprising at least one monitoring circuit as described above. The operating parameters of the monitoring circuit can be assumed to be correlated with the operating parameters of nearby portions of the integrated circuit and so the monitoring circuit can be used to monitor conditions of the integrated circuit. Since the operating conditions can have some local variation across the integrated circuit, placing more than one monitoring circuit at various locations on the chip enables the local operating parameters to be monitored.

Viewed from yet another aspect, the present invention provides a monitoring system comprising:

(i) a first ring oscillator circuit configured to generate a first oscillating signal, said first ring oscillator circuit comprising a plurality of serially connected first inverting stages, wherein at least one of said first inverting stages comprises:

(a) at least one p-type leakage transistor configured to operate in a first leakage mode in which substantially all current through said at least one p-type leakage transistor is a first leakage current; and (b) a first capacitive element configured to be charged in dependence on said first leakage current, a first oscillation period of said first oscillating signal being dependent on a rate at which said first capacitive element is charged; and (ii) a second ring oscillator circuit configured to generate a second oscillating signal, said second ring oscillator circuit comprising a plurality of serially connected second inverting stages, wherein at least one of said second inverting stages comprises:

(c) at least one n-type leakage transistor configured to operate in a second leakage mode in which substantially all current through said at least one n-type leakage transistor is a second leakage current; and (d) a second capacitive element configured to be discharged in dependence on said second leakage current, a second oscillation period of said second oscillating signal being dependent on a rate at which said second capacitive element is discharged;

wherein said operating parameter controls a magnitude of said first leakage current and said second leakage current such that said first oscillation period and said second oscillation period are indicative of said operating parameter.

When manufacturing a silicon transistor, process variations such as variations in temperature or humidity can cause doping concentrations (and hence electron or hole mobility) in the silicon to vary from transistor to transistor. This means that the rate at which a transistor switches between an on and off state can vary from transistor to transistor. Also, in some parts of a chip p-type transistors could switch more rapidly than n-type transistors, or vice versa. A "process corner" is an area of a chip where transistors switch at a different rate to transistors of another area of the chip. Process corners can be classified as the following types: TT (typical n-type, typical p-type), SS (slow n-type, slow p-type), FF (fast n-type, fast p-type), SF (slow n-type, fast p-type) and FS (fast n-type, slow p-type). For SF or FS corners, the p- and n-type transistors switch at different rates. This means that a monitoring circuit using n-type leakage transistors will behave differently to a monitoring circuit using p-type leakage transistors. Generally, the monitoring circuit having leakage transistors corresponding to the slower switching charge carrier type will provide a more precise result (because a counter having a fixed count frequency will measure more counts per oscillation period for the slower switching charge carrier type than for the faster switching charge carrier type). However, it is not possible to determine in advance which type of monitoring circuit should be used because the process variations are random and so the locations of process corners are therefore unpredictable. Therefore, it can be useful to provide a monitoring system comprising a first ring oscillator circuit having p-type leakage transistors and a second ring oscillator circuit having n-type leakage transistors. The monitoring system can be provided on an integrated circuit during manufacture, before it can be known what corner types will arise. When in use, then either the first oscillation period or the second oscillation period can be selected.

The monitoring system can also be used to identify highly skewed corners (SF or FS) by measuring the oscillation period simultaneously using both the n-type and the p-type ring oscillator circuit, and then comparing the operating parameter values determined using the measured oscillation period. SF or FS corners can be identified when the operating parameter values obtained from the n- and p-type leakage-based circuits are significantly different. If it is determined that the silicon in the monitoring circuit has a highly skewed corner type, then it is likely that the surrounding portions of the integrated circuit will have the same corner type.

Viewed from another aspect the present invention provides a monitoring circuit for monitoring an operating parameter of an integrated circuit, said monitoring circuit comprising:

ring oscillator means for generating an oscillating signal, said ring oscillator means comprising a plurality of serially connected inverting stage means;

wherein at least one of said inverting stage means comprises:

(a) at least one leakage transistor means for operating in a leakage mode in which substantially all current through said at least one leakage transistor means is a leakage current; and (b) capacitive means for being charged or discharged in dependence on said leakage current, an oscillation period of said oscillating signal being dependent on a rate at which said capacitive means is charged or discharged;

and said operating parameter controls a magnitude of said leakage current such that said oscillation period is indicative of said operating parameter.

Viewed from another aspect the present invention provides a method for monitoring an operating parameter of an integrated circuit, said method comprising the steps of:

generating an oscillating signal with a ring oscillator circuit comprising a plurality of serially connected inverting stages, at least one of said inverting stages comprising at least one leakage transistor and a capacitive element;

operating said at least one leakage transistor in a leakage mode in which substantially all current through said at least one leakage transistor is a leakage current; and charging or discharging said capacitive element in dependence on said leakage current, an oscillation period of said oscillating signal being dependent on a rate at which said capacitive element is charged or discharged;

wherein said operating parameter controls a magnitude of said leakage current such that said oscillation period is indicative of said operating parameter.

Viewed from a further aspect, the present invention provides a method of calibrating a ring oscillator circuit for monitoring an operating parameter of an integrated circuit, the method comprising the steps of:

performing the method of monitoring an operating parameter of an integrated circuit as described above, with said ring oscillator circuit operating at a known operating parameter value;

measuring a quantity indicative of said oscillation period;

calculating at least one calibration coefficient in dependence on said quantity measured and said known operating parameter value; and storing said at least one calibration coefficient for use when monitoring an unknown operating parameter value.

Calibration is used to enable an absolute operating parameter value to be determined based on a measured oscillation period value. To calibrate the monitoring circuit, the ring oscillator circuit is operated at a known operating parameter value, and a quantity indicative of the oscillating period is measured at that known operating parameter value. Using the measured quantity and the known operating parameter value, at least one calibrating coefficient is calculated and stored for future use when monitoring an unknown operating parameter value.

Viewed from another aspect the present invention provides a method for determining an unknown operating parameter value of an integrated circuit, comprising the steps of:

performing the method of monitoring an operating parameter of an integrated circuit as described above, with said ring oscillator circuit operating at said unknown operating parameter value;

measuring a quantity indicative of said oscillation period; and calculating said unknown operating parameter value using said quantity and at least one predetermined calibration coefficient.

To obtain a measurement of an unknown parameter value, the ring oscillator circuit is operated at the unknown parameter value, the quantity indicative of the oscillation period is measured, and the unknown operating parameter value is calculated using the quantity measured and the at least one predetermined calibration period that has been stored during calibration.

In the above calibrating and determining methods, the quantity indicative of the oscillation period may be, for example, a counter value which gradually increments until the oscillating signal value changes between a high state and a low state. The counter value at the time that the signal switches between high and low is an indication of the oscillation period. Alternatively, another quantity indicating the oscillation period, such as the oscillation frequency of the oscillating signal, can be used as a quantity indicative of the oscillation period.

BRIEF DESCRIPTION OF THE DRAWINGS

The present invention will be described further, by way of example only, with reference to embodiments thereof as illustrated in the accompanying drawings, in which.

DESCRIPTION OF EMBODIMENTS

Figure 1:
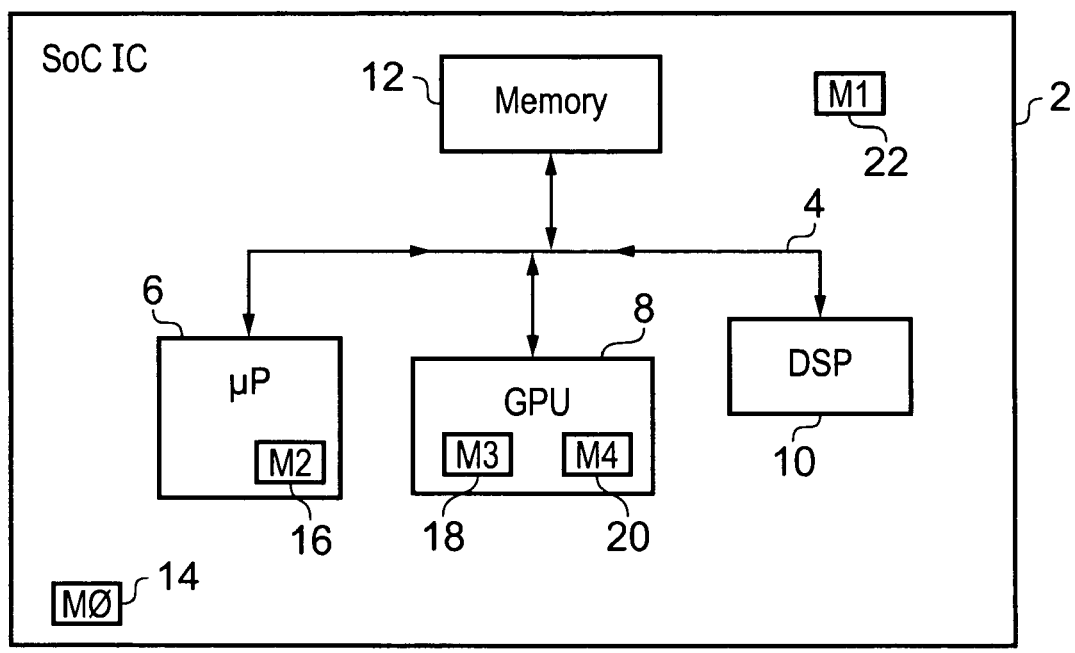
FIG. 1 schematically illustrates an integrated circuit comprising a number of monitoring circuits for monitoring operating parameters of the integrated circuit.

FIG. 1 schematically illustrates a system-on-chip integrated circuit 2 including a plurality of functional units 6, 8, 10, 12 interconnected via a system bus 4. The functional units include a processor core 6, a graphics processing unit 8, a digital signal processor 10 and a memory 12. It will be appreciated that the present techniques are applicable in a wide variety of different integrated circuits and that the precise arrangement of functional units is not important.

Located within the integrated circuit 2 are a plurality of monitoring circuits 14, 16, 18, 20, 22. The monitoring circuit 16 is located within the processor 6 and serves to monitor an operating parameter of the processor 6. This operating parameter may be, for example, threshold voltage levels associated with a low power state for reducing leakage current, an operating voltage, an operating temperature or the like. In a similar way, there are monitoring circuits 18, 20 embedded within the graphics processing unit 8. Further monitoring circuits 14, 22 are provided at spaced positions upon the integrated circuit 2 to monitor parameters such as the operating temperature and/or threshold voltage. Each of the monitoring circuits 14, 16, 18, 20, 22 includes a ring oscillator circuit according to one of the embodiments described below.

It will be appreciated that operating parameters such as operating temperature may vary within the integrated circuit 2, such that one particular portion of that integrated circuit may be operating too hot at the same time as another portion is operating at an acceptable temperature. Accordingly, the provision of multiple monitoring circuits 14, 16, 18, 20, 22 distributed within the integrated circuit provides a greater degree of protection from inappropriate operation and permits a more accurate and fine-grained level of operating parameter monitoring to be achieved than if only one monitoring circuit was provided. Furthermore, process variations across the integrated circuit 2, such as variations in alignment, doping, layer thickness etc, may result in different operating parameters occurring at different locations within the same integrated circuit and accordingly distributing a plurality of monitoring circuits 14, 16, 18, 20, 22 through the integrated circuit 2 enables such different operating parameters to be correctly sensed.

Figure 2:
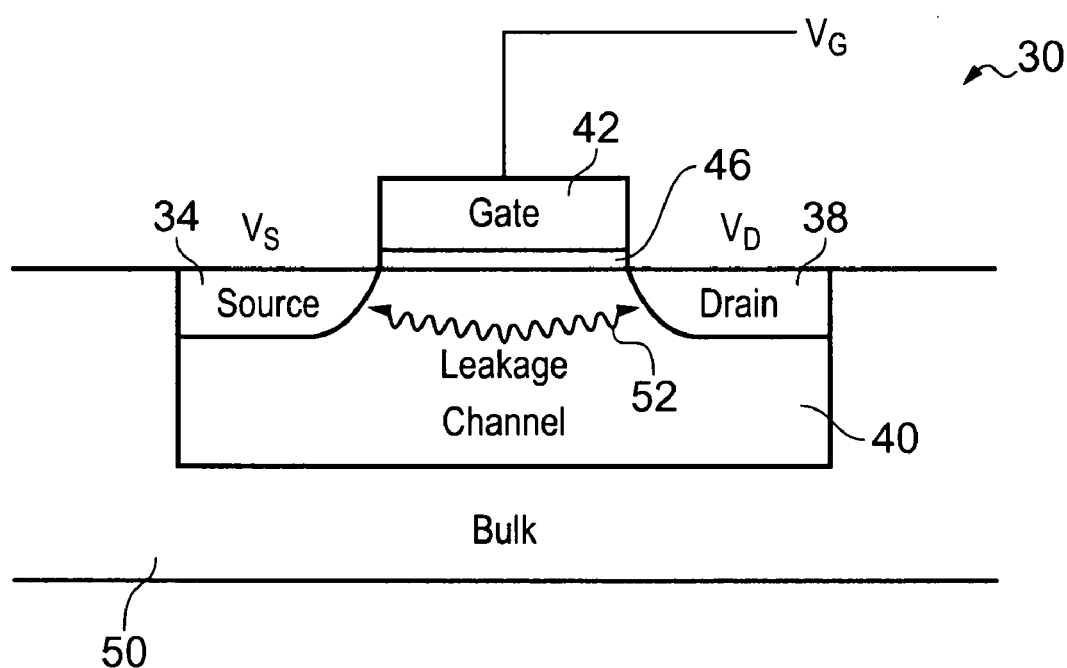
FIG. 2 schematically illustrates leakage current in a field effect transistor.

FIG. 2 illustrates a cross section through a field effect transistor 30. The field effect transistor 30 includes a source region 34, a drain region 38 and a channel region 40 extending between the source region 34 and the drain region 38. A gate 42, separated from the channel region 40 by an insulating layer 46, is provided to control current flow between the source region 34 and the drain region 38 through the channel region 40. The channel region 40 and the other portions of the field effect transistor 30 are formed on a bulk semiconductor region 50. The gate 42 is held at a gate potential $V_G$, the source region 34 is held at a source potential $V_S$, and the drain region 38 is held at a drain potential $V_D$.

The voltage $V_G$ applied to the gate 42 controls whether the field effect transistor 30 is in an "on" state or an "off" state. When the transistor 30 is in the "on" state, current flows between the source region 34 and the drain region 38. When the transistor 30 is in the "off" state, one would normally consider there to be no current flowing between the source region 34 and the drain region 38. However, due to effects such as quantum tunnelling, a finite amount of current may pass between the source region 34 and the drain region 38 even when the resistor 30 is in the "off" state. This current is known as a leakage current 52.

This phenomenon may be referred to as subthreshold leakage, since the leakage current occurs when the voltage difference between the gate and the source $(V_G-V_S)$ is below a threshold level. When the transistor 30 is in a leakage mode (i.e. the transistor is in the "off" state and the gate-source voltage difference is below the threshold level), substantially all current passing between the source region 34 and the drain region 38 is leakage current. The leakage current scales exponentially with temperature and gate-source voltage difference. Therefore, by holding one of these operating parameters constant, the leakage current can be used as an indicator of the other operating parameter.

Figure 3:
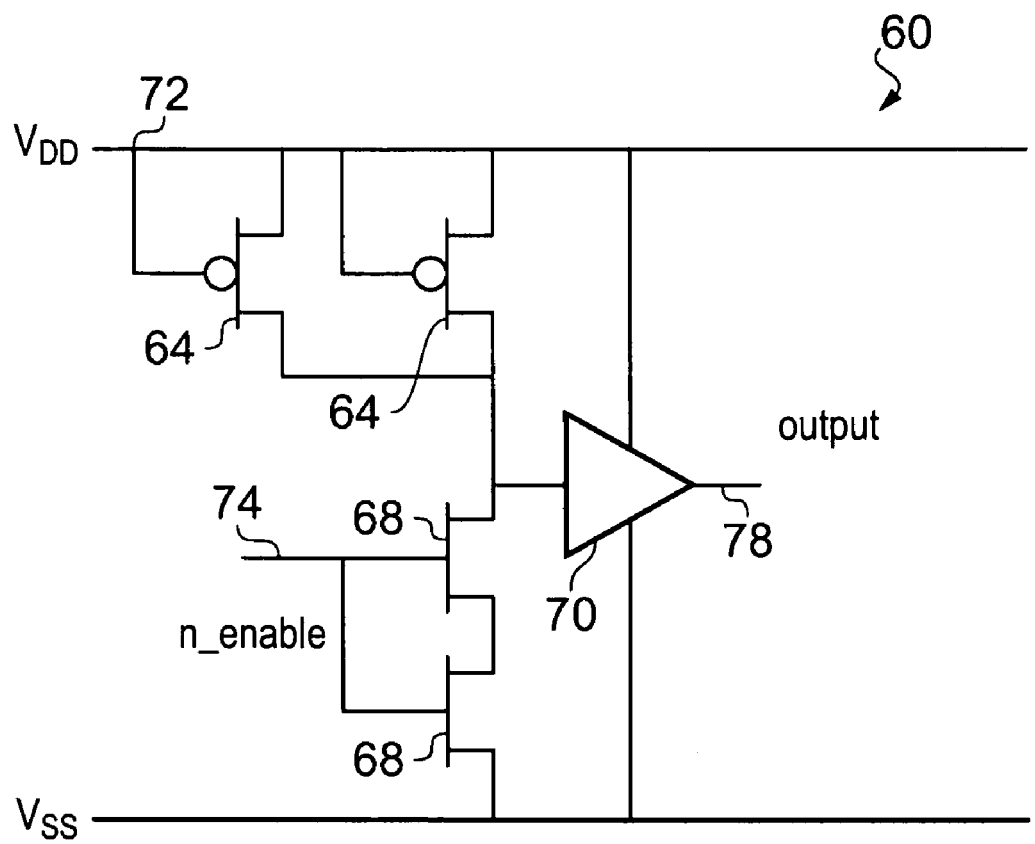
FIG. 3 schematically illustrates an inverting stage of a p-type leakage-based ring oscillator circuit.

FIG. 3 shows an example of an inverting stage 60 for use in a ring oscillator for providing a leakage-based operating parameter measurement. The inverting stage 60 comprises one or more leakage transistors 64, one or more pull-down transistors 68 and a buffer 70. The leakage transistors 64 are controlled to operate in a leakage mode. In this example embodiment, this is done by coupling the gate of the leakage transistor 64 to the supply rail 72 so that the p-type leakage transistors 64 are permanently held in an "off" state in which substantially all of the current passing through the transistor 64 is leakage current. The pull-down transistors 68 are controlled by an enable signal 74. The pull-down transistors 68 are coupled between the buffer 70 and a ground supply rail 76, while the leakage transistors 64 are coupled between the supply rails 72 and the buffer 70.

In this embodiment, a capacitive element is formed by a metal-on-silicon interface of one or more transistors forming part of the buffer 70 (for example at the buffer input), and may also include capacitance provided by wiring of the inverter stage 60. While the enable signal 74 is high then the current flow from the ground power rail 76 prevents the leakage current through the leakage transistors 64 from charging the capacitive element. Once the enable signal 74 is switched to a low value then the pull-down transistors 68 are switched off so that the leakage current flowing through the leakage transistor 64 charges the capacitive element. While FIG. 3 shows an arrangement in which the capacitive element is charged by the leakage current, alternative circuits can be devised in which the leakage current instead discharges the capacitive element towards ground.

The PFET leakage transistors 64 can be made to be smaller than the NFET pull-down transistors 68 to ensure that the leakage current through the PFET leakage transistors 64 dominates relative to the leakage current through the larger NFET pull-down transistors 68 when the NFET pull-down transistors 68 are in the "off" state. As the leakage current flows to the capacitive element, the capacitive element gradually charges. The buffer 70 is controlled to switch the stage output signal 78 each time the capacitive element is charged or discharged beyond a threshold charge level. Thus, as the enable signal 74 is switched from high to low then the pull-down transistors 68 are turned off and the output 78 of the buffer 70 is switched from a low value to a high value after a delay dependent on the leakage current flowing through the transistor 64. Similarly, when the enable signal switches from low to high, the pull-down transistors 68 are switched on and the buffer 70 switches the output signal 78 to a low value as the capacitive element is quickly discharged to ground. Since the leakage current is dependent on operating parameters such as temperature and supply voltage, then the signal propagation delay through the inverting stage 60 (which controls the oscillation period of an ring oscillator circuit) is dependent on the operating parameters.

In FIG. 3, two leakage transistor 64 and two pull-down transistors 68 are shown. However, the invention is not restricted to this number of transistors and any number of leakage transistors 64 and pull-down transistors 68 can be used. Multiple leakage transistors 64 can be connected in parallel to provide a greater amount of leakage current through the leakage transistors 64 than when a single leakage transistor 64 is used. Multiple pull-down transistors 68 can be connected in series as shown in FIG. 3 in order to provide a lower amount of leakage current through the pull-down transistors 68 than when a single pull-down transistor 68 is used (reducing the amount of leakage through the pull-down transistors 68 is desirable since this leakage would otherwise resist the charging or discharging of the capacitive element by the leakage current through the leakage transistors 64).

Figure 4:
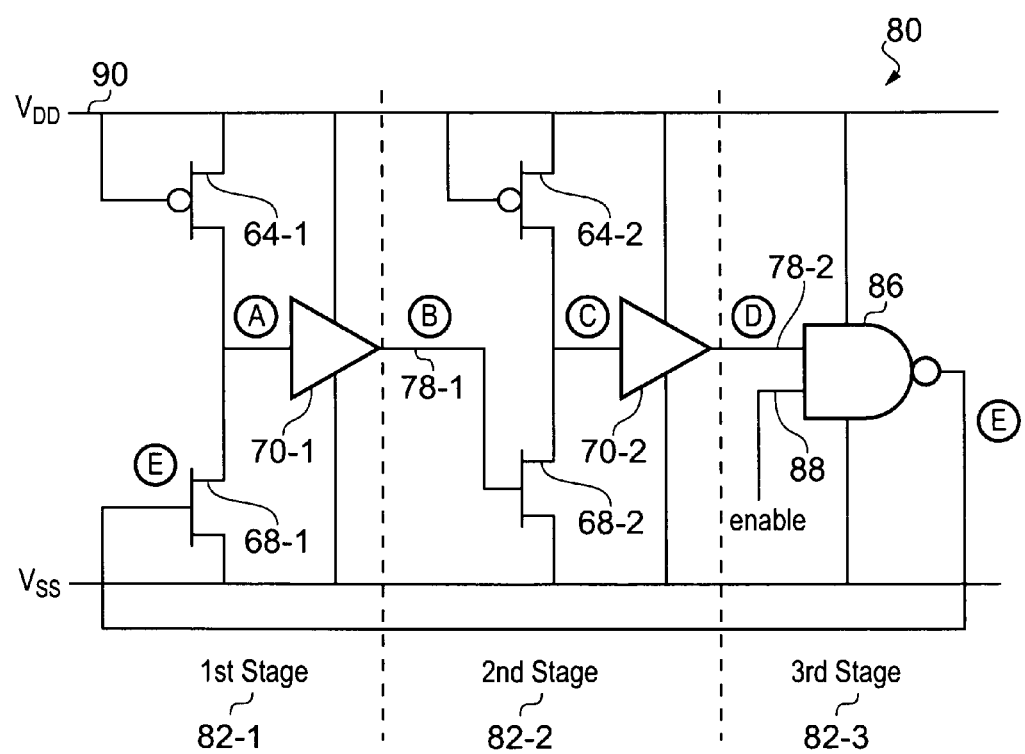
FIG. 4 illustrates a ring oscillator circuit comprising a number of inverting stages according to FIG. 3.

FIG. 4 shows a ring oscillator circuit 80 comprising multiple inverting stages 82. The ring oscillator can also be referred to as a relaxation oscillator. In this example, first and second inverting stages 82-1, 82-2 are of the type shown in FIG. 3. The buffer output 78-1 of the first inverting stage is input to the gate of the pull-down transistor 68-2 of the next inverting stage 82-2. For conciseness, a single leakage transistor 64-1, 64-2 and a single pull-down transistor 68-1, 68-2 has been shown in each stage, although these can be replaced by parallel leakage transistors or stacked pull-down transistors as described above with reference to FIG. 3.

The third stage of the ring oscillator 80 comprises a NAND gate 86. An enable signal 88 and the output 78-2 of the buffer 70-2 of the second inverting stage 82-2 are combined in a NAND operation by the NAND gate 86. The output of the NAND gate 86 is cycled round as an input to the pull-down transistor 68-1.

The ring oscillator circuit 80 involves three inversions of the signal propagating through the circuit. First, the effect of the leakage transistor 64-1 and the pull-down transistor 68-1 is to invert the gate input to the pull-down transistor 68-1. Secondly, the transistors 64-2 and 68-2 of the second inverting stage 82-2 invert the buffer output 78-1 of the first inverting stage 82-1. Also, when the enable signal 88 is high, the NAND gate 86 inverts the output 78-2 of the buffer 70-2 of the second inverting stage 82-2. The output of the NAND gate 86 is then recycled as an input to the pull-down transistor 64-1. While three stages, with three inversions, are provided in the ring oscillator 80, the total number of inverting stages 82 and inversions is not important, although there should be an odd number of inversions around the ring so that the signal at any point around the ring oscillator 80 will oscillate between high and low values. The higher the number of inverting stages, the longer the oscillation period will be, since the signal will take longer to propagate through the ring oscillator 80 when the ring oscillator 80 has more stages.

The enable signal 88 acts to control whether or not the oscillator circuit 80 is generating an oscillating signal. When the enable signal 88 is low, then the output of the NAND gate 86 must always be high and so the pull-down transistor 68-1 is permanently in an "on" state, thus preventing the capacitive element at the buffer 70 from being charged above the ground supply level. Thus, the buffer output 78-1 would always be at a low level and so the second inverting stage 82-2 would have the pull-down transistor 68-2 permanently in an "off" state, thus allowing the capacitive element formed at least in part by the buffer 70-2 to be charged by the leakage current through the leakage transistor 64-2. All signal values would remain constant and so there would be no oscillations.

On the other hand, when the enable signal 88 is high, then the NAND gate 86 outputs a value which oscillates in dependence on the value of the input to the NAND gate 86. As a result of the odd number of inversions around the loop, an oscillating signal is generated by the ring oscillator circuit 80, and the oscillation period of the oscillating signal can be measured by analysing the signal passing at one of the points marked A to E in FIG. 4. The oscillation period is indicative of the operating parameter, which in the embodiment of FIG. 4 would be temperature because the leakage transistors 64-1 and 64-2 are coupled to the supply rail 90. If supply voltage is to be measured as the operating parameter then the leakage transistor 64 should be provided with a gate voltage supply that is independent of the supply rail 90. In this case, then the voltage can be varied and so the supply voltage can be considered as an operating parameter that can be measured by the system. This can be useful if, for example, the gates of the leakage transistors 64-1 and 64-2 are supplied with a signal generated by part of the integrated circuit 2, in which case the monitoring circuit 80 can be used to measure the voltage level of the generated signal.

The buffers 70 act so that when an input signal (proportional to the charge accumulated on the associated capacitive element) rises above a buffer threshold level, then the buffer 70 switches its output signal 78 to a high level, while when the input signal drops below the threshold level the output signal 78 is switched to a low level. In this way, the buffer 70 avoids an intermediate value being passed to the next inverting stage, thus ensuring that the pull-down transistor 78-2 or NAND gate 86 downstream from the buffer 70-1 or 70-2 is turned fully on or fully off.

Figure 5:
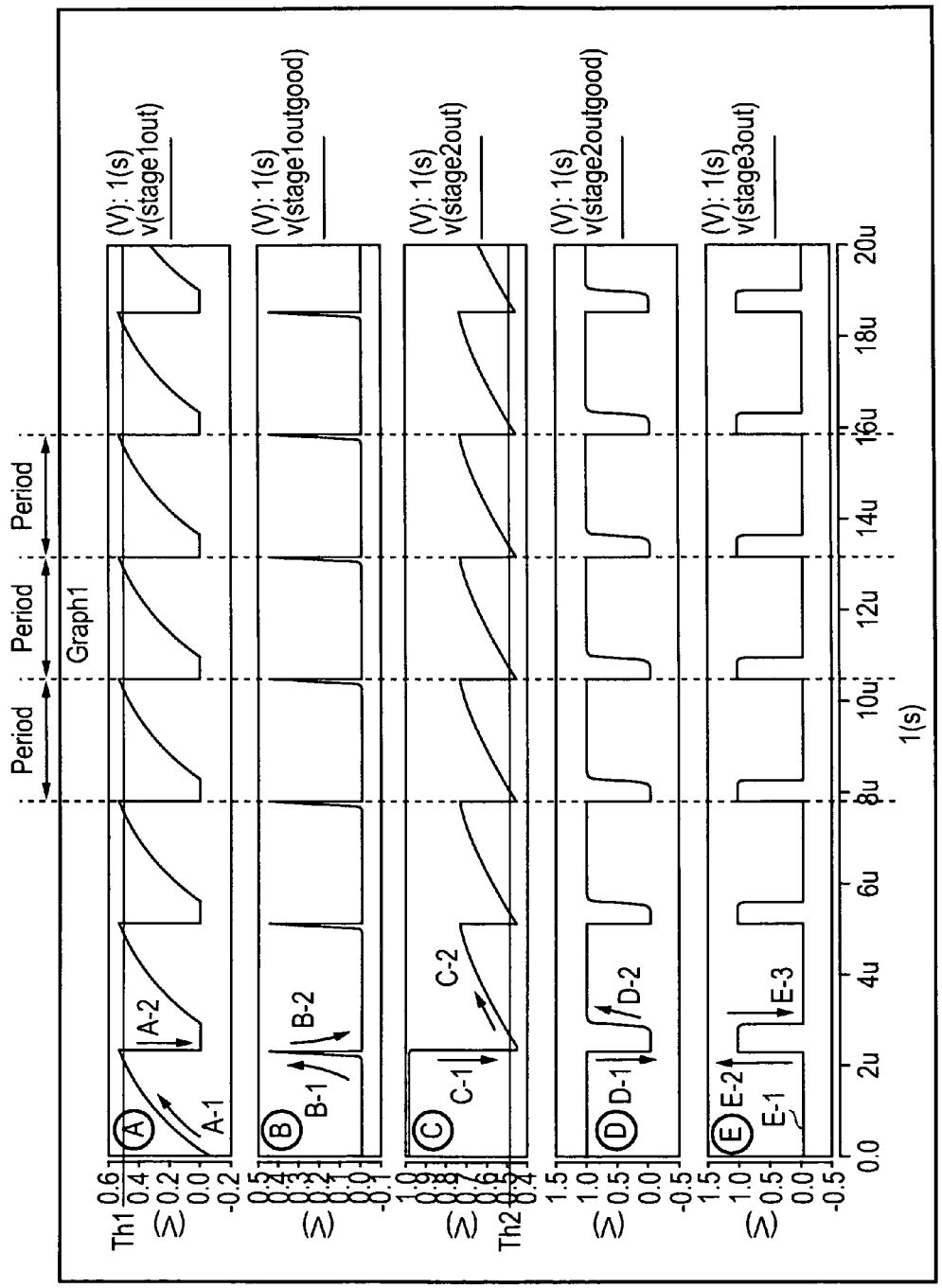
FIG. 5 is a waveform diagram illustrating the profiles and relative timings of oscillating signals at various points of the ring oscillator illustrated in FIG. 4.

FIG. 5 shows a diagram showing the profile and timings of the oscillating signals being propagated at various points of the ring oscillator circuit 80. Each waveform in FIG. 5 is labelled with a letter and indicates the signal occurring at the point labelled with the corresponding letter in FIG. 4. Waveform A represents the signal at the capacitive element near the input of the buffer 70-1 and is proportional to the charge accumulated at the capacitive element. Waveform B represents the output 78-1 of the buffer 70-1, which is input to the pull-down transistor 68-2. The buffer output 78-1 (waveform B) is switched to a high level when the charge on the capacitive element (waveform A) is above a threshold level Th1 and switched to a low level when the charge is below the threshold level Th1. Waveform C represents the signal at the input to buffer 70-2 and is proportional to the charge accumulated on the capacitive element of the second inverting stage 82-2. Waveform D represents the output of the buffer 70-2, which is input into the NAND gate 86. Again, the output of the buffer 72-2 is dependent on whether the capacitive element at the buffer 70-2 is charged above or below a threshold level Th2. Waveform E represents the output of the NAND gate 86 that is fed as an input to the pull-down transistor 68-1.

FIG. 5 assumes that the enable signal 88 is held at a high level (when the enable signal 88 is low then there will be no oscillations). At the start of the time period shown in FIG. 5, the output of the NAND gate 86 is low (see E-1 in FIG. 5) and so the pull-down transistor 68-1 is in the "off" state. Therefore, the leakage current through the leakage transistor 64-1 gradually charges the capacitive element in the buffer 70-1 (A-1). Once the capacitive element is charged beyond a threshold level Th1 then the buffer 70-1 switches its output 78-1 to a high level (B-1). This switches on the pull-down transistor 68-2, which discharges the capacitive element in the second inverting stage 82-2 (C-1). When the capacitive element is discharged beyond a threshold level Th2, the buffer output 78-2 of the second inverting stage 82-2 is switched to a low value (D-1) and the NAND gate 86 then switches its output to a high level value (E-2). This in turn switches on the pull-down transistor 68-1 of the first inverting stage 82-1 and hence the capacitive element of the first inverting stage 82-1 is discharged to ground (A-2). As the capacitive element is discharged beyond the charge threshold level Th1, buffer 70-1 sets its output 78-2 to a low value (B-2). When the buffer output 78-2 is set to the low value, the pull-down transistor 68-2 is switched to the off state and so then the leakage current through transistor 64-2 begins charging the capacitive element in the second inverting stage 82-2 (C-2). Once the capacitive element of the second inverting stage 82-2 reaches the threshold level Th2 then the buffer output 78-2 is switched back to a high value (D-2), which then resets the output of the NAND gate to a low value (E-3). The cycle then repeats again. If the operating parameter being monitored does not change then the oscillations repeat with a constant period as indicated in FIG. 5. The period of the oscillating signal can be measured at any point in the circuit since the period of each signal shown in FIG. 5 is the same. Measuring the oscillation period is likely to be easiest where the pulses are relatively square and wide (for example, as in D or E). The period can be measured by a counting technique, for example. The period gives an indication of the operating parameter.

In the example of FIG. 5, both threshold levels Th1 and Th2 are set at a level equivalent to half the supply voltage provided by power rail 90. However, these threshold values could be varied. Varying the threshold values will change the relative timings and profiles of the waveforms from those shown in FIG. 5 as this will cause the capacitive elements to reach the threshold levels Th1 or Th2 more quickly or slowly.

Figure 6:
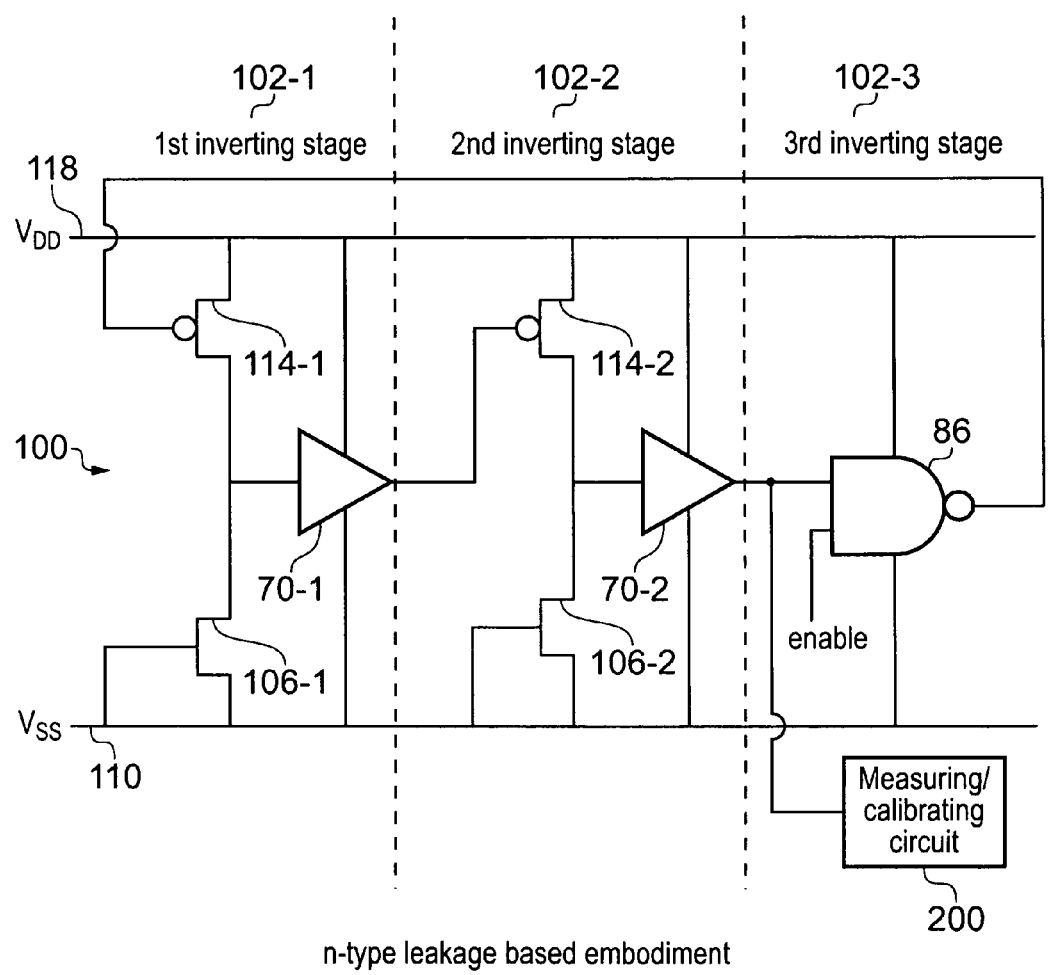
FIG. 6 shows an n-type leakage-based ring oscillator circuit.

FIG. 6 shows a variant on the ring oscillator circuit 80 of FIG. 4. In FIG. 6, the ring oscillator circuit 100 is based on n-type leakage rather than p-type leakage. The ring oscillator circuit 100 again has three inverting stages 102-1, 102-2, 102-3. However, this time the first and second inverting stages 102-1, 102-2 each have an n-type leakage transistor 106 coupled between the ground rail 110 and the capacitive element provided at least in part by the buffer 70. A p-type pull-up transistor 114 is coupled between the capacitive element and the supply power rail 118. The leakage transistor 106 in this example has its gate coupled to the ground supply rail 110, while the p-type pull-up transistor 114 has its gate coupled to the output of a previous inverting stage 102. The ring oscillator 100 of FIG. 6 produces a similar oscillation to that shown in FIG. 5, but this time it is the leakage current through the n-type transistor 106-1 that drives the oscillation by gradually discharging the capacitive element, and the p-type transistor 114 that when switched on by the output of a previous stage charges the capacitive element to the supply level. Thus, we can see from FIGS. 4 and 6 how both p- and n-type leakage-based ring oscillators 80, 100 can be provided.

Figure 7:
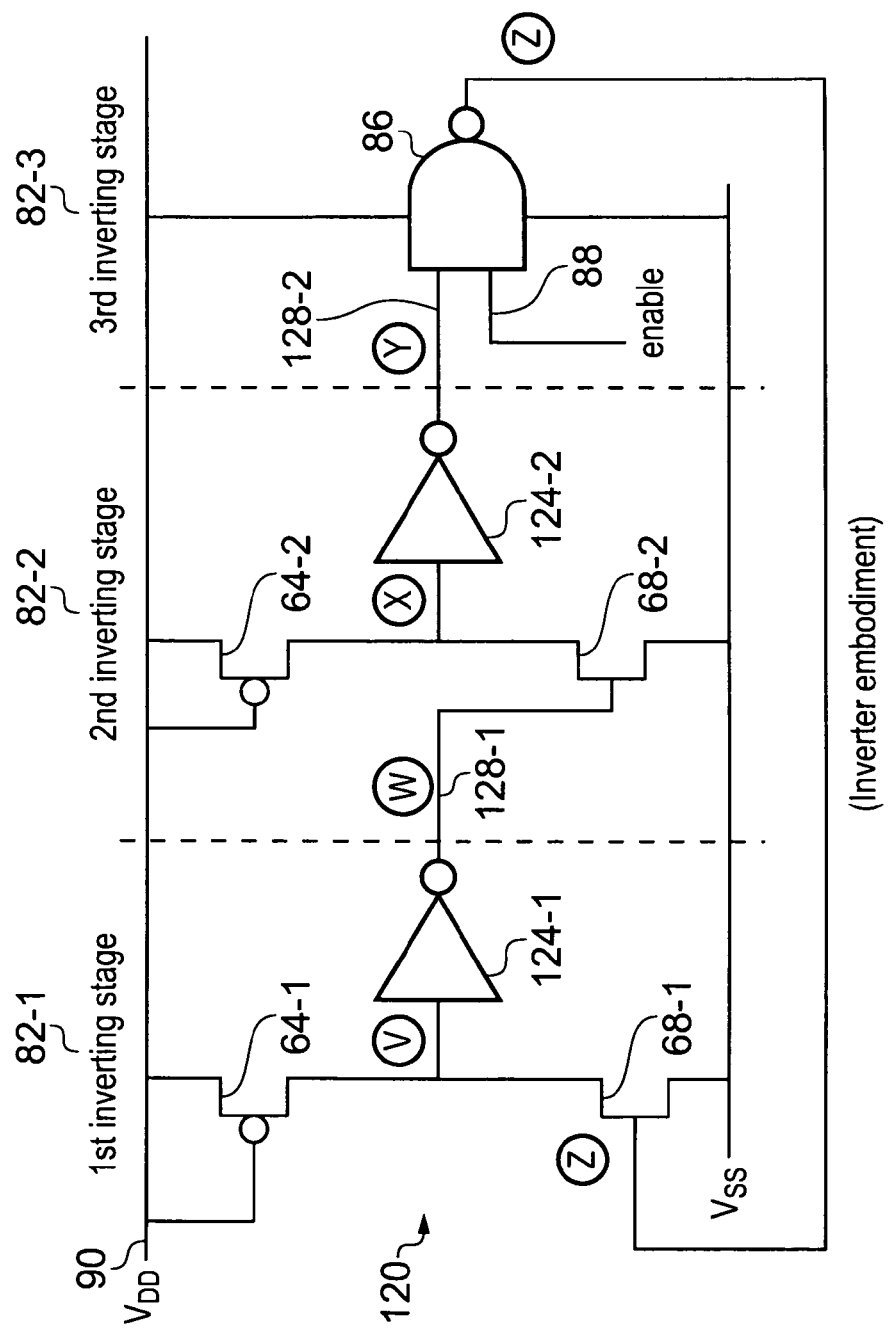
FIG. 7 illustrates a ring oscillator circuit in which inverters are provided to supply an oscillating signal to a following inverting stage.

FIG. 7 shows another example of a ring oscillator circuit 120. The ring oscillator circuit 120 is similar to that of FIG. 4 and so similar elements are labelled with the same reference numerals. Ring oscillator circuit 120 differs from ring oscillator circuit 80 in that the buffers 70-1, 70-2 have been replaced with inverters 124-1, 124-2. Thus, five inversions occur on a single pass through the ring oscillator circuit 120, compared with three inversions in the ring oscillator circuit 80.

Figure 8:
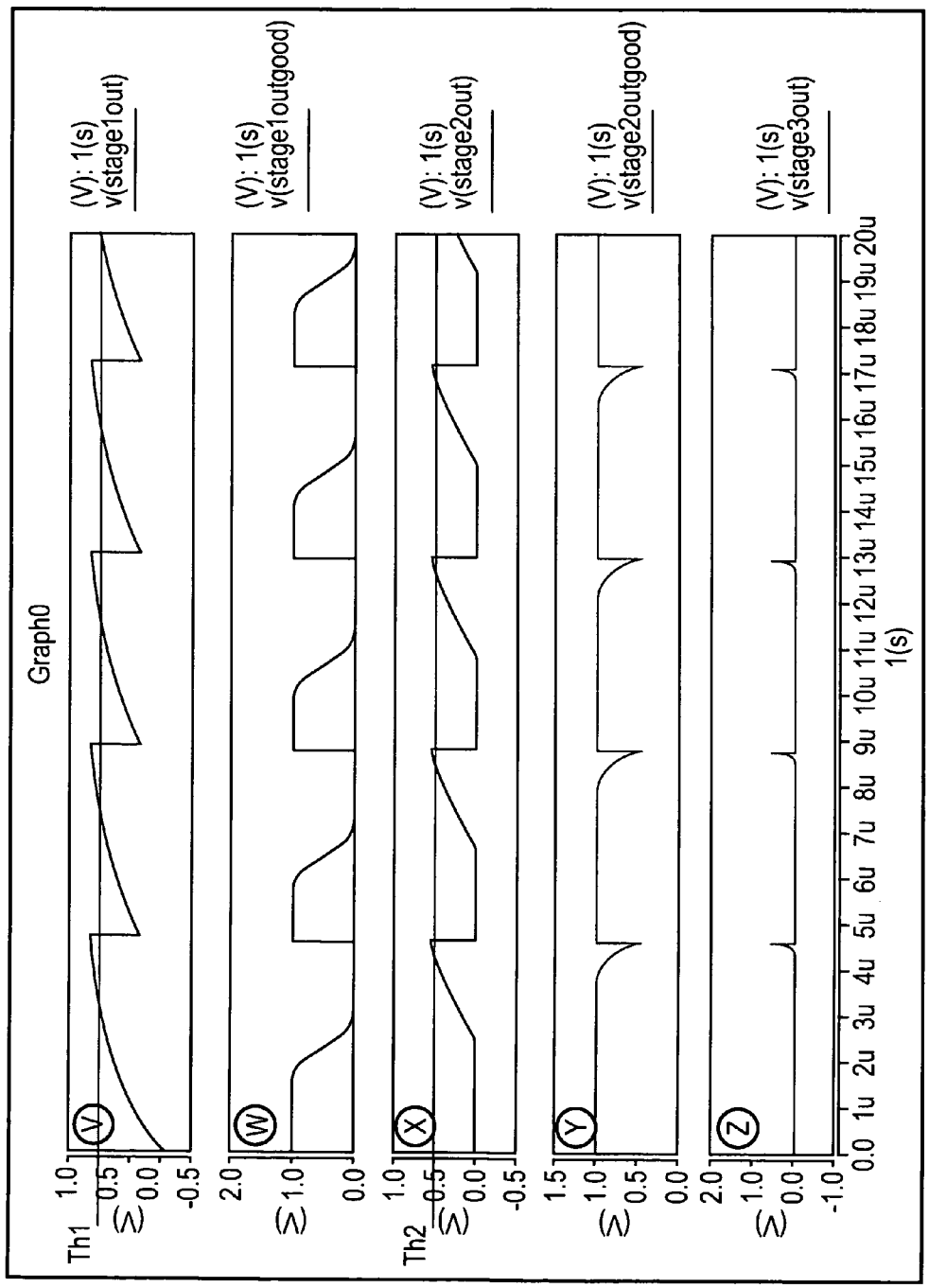
FIG. 8 illustrates a waveform diagram illustrating the profiles and relative timings of oscillating signals at various points of the ring oscillator signal of FIG. 7.

FIG. 8 shows the relative profiles and timings of the signals at points V to Z as marked in FIG. 7. The mechanism of the oscillation is similar to that discussed in relation to FIG. 5. However, in contrast to the buffers 70 of FIG. 4, the inverters 124 switch their output signal 128 to a high level when the buffer input signal (proportional to the charge accumulated on the capacitive element) drops below the threshold level Th1 or Th2, and switch the output signal 128 to a low level when the buffer input signal rises above the threshold level. This means that the signals shown in FIG. 8 have a different shape. By comparing FIGS. 5 and 8, we can see how in part W of FIG. 8 the pulse is relatively wide and is not a sharp glitchy pulse as in part B of FIG. 5. This means that in the FIG. 7 embodiment it is easier to measure the oscillation period using the signal at point W. In contrast, at points Y and Z the signals are narrower and less square than those at points D and E shown in FIG. 5.

It will be appreciated that the inverters 124-1, 124-2 of FIG. 7 can also be used with the n-type embodiment of FIG. 6. In this case, the capacitive elements would be being discharged by the leakage current through an n-type leakage transistor 106-1 as in FIG. 6, rather than being charged by the leakage current through a p-type leakage transistor 64-1 as shown in FIGS. 7 and 8.

Figure 9:
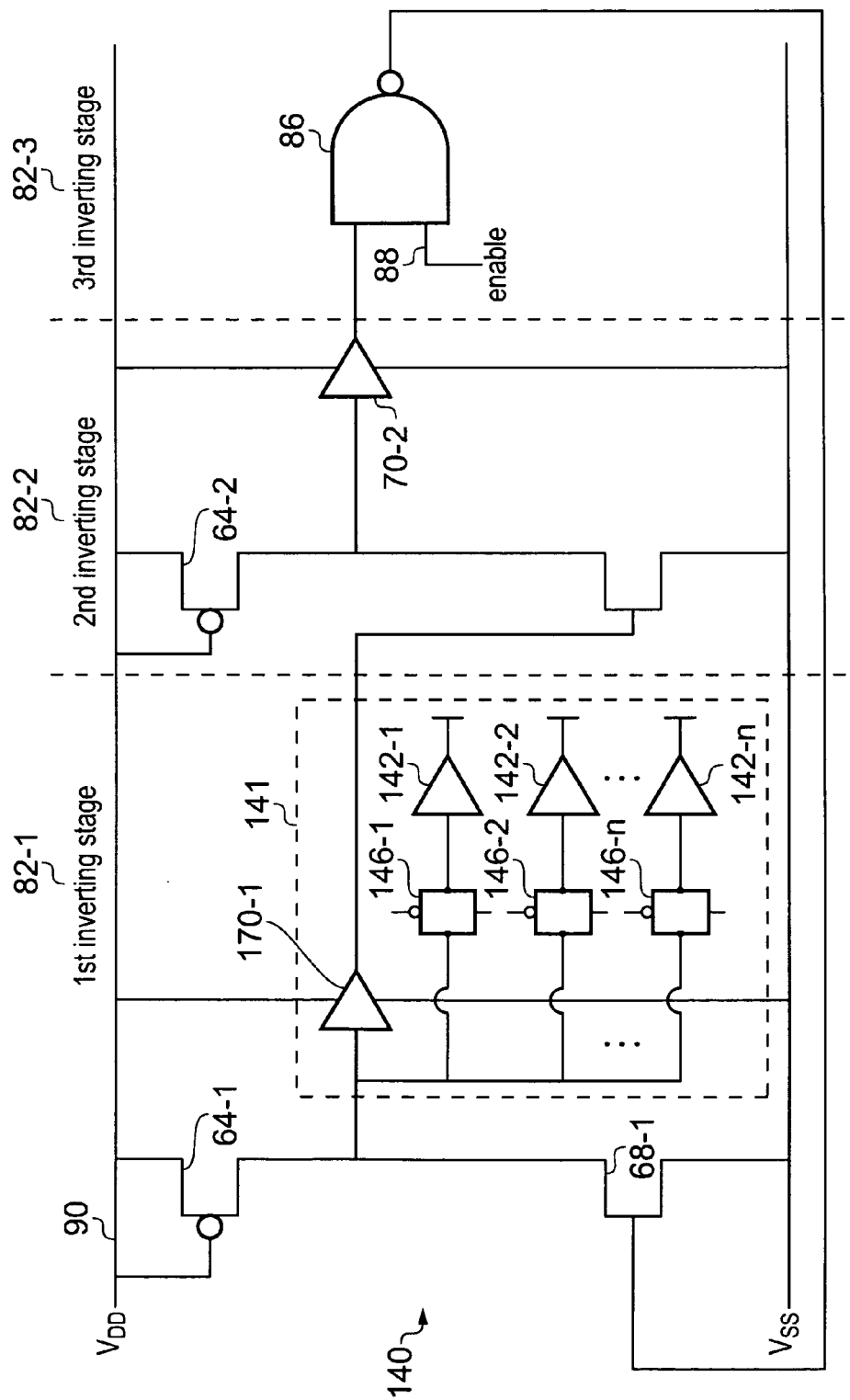
FIG. 9 illustrates a ring oscillator circuit in which a capacitive element having configurable capacitance is provided.

FIG. 9 shows an embodiment of a ring oscillator 140 in which a capacitive element 141 with a configurable capacitance is provided. The ring oscillator circuit 140 has at least one inverting stage (in this example the first inverting stage 82-1, but other inverting stages may be formed in a similar way to stage 82-1), in which the capacitive element is provided with a principal capacitive element 70-1 and one or more additional capacitive elements 142-1, 142-2, 142-n. In this example, the principal capacitive element 70-1 and each additional capacitive element 142 is formed as part of a buffer, but other forms of capacitance can also be used. Each additional capacitive element 142-1, 142-2, 142-n is associated with a respective transmission gate 146-1, 146-2, 146-n responsive to control signals to selectively switch each additional capacitive element into an active mode in which leakage current through the leakage transistor 64-1 can flow to or from the additional capacitive element 142. The transmission gates 146 can be controlled so as to switch individual additional capacitive elements 142 into the active mode when required so as to temporarily increase the capacitance of the capacitive element 141 as a whole.

When an additional capacitive element 142 is placed in the active state, then charge which previously flowed to the principal capacitive element 140 will be diverted to one of the additional capacitive elements 142, and so the principal capacitive element 70-1 will take longer to charge. Alternatively, in an embodiment in which the capacitive element 141 is being discharged by the leakage current, the leakage current will remove some charge from the additional capacitive element 142 instead of the principal capacitive element 70-1, and so the principal capacitive element 70-1 will be discharged more slowly. In either case, the propagation of the oscillating signal through the first inverting stage 82-1 is delayed and so the period of the oscillating signal is increased. Thus, the additional capacitive portions can be considered as a delaying element. Although FIG. 9 illustrates three additional capacitive elements 142, any number of elements 142 and associated transmission gates 146 can be provided.

Figure 10:
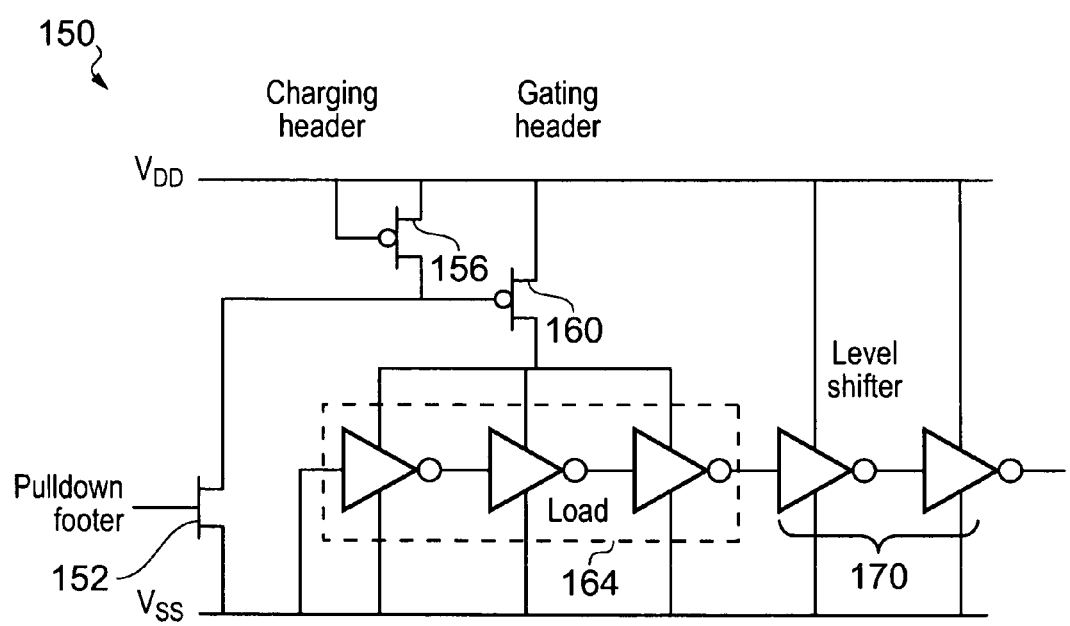
FIG. 10 illustrates an inverting stage of a ring oscillator in which first and second capacitive elements are coupled in series to be charged or discharged one after the other.

FIG. 10 shows an alternative type of inverting stage 150 for use in a ring oscillator circuit. The inverting stage 150 comprises a pull-down transistor 152, a p-type leakage transistor 156, a gating transistor 160 and a load 164. The output of the load 164 is input into a level shifter 170. The gating transistor 160 has some inherent capacitance, for example in its gate interface, and so acts as a first capacitive element that is charged by the leakage current leaking through the leakage transistor 156. The capacitive element in the gating transistor 160 is initially discharged to ground when the pull-down transistor 152 is switched on, but when the pull-down transistor 152 is turned off then the leakage current through the leakage transistor 156 slowly charges the capacitive element at the gating transistor 160. When the charge accumulated at the first capacitive element reaches a threshold value then the gating transistor 160 is turned off and so a second capacitive element formed by circuit elements of the load 164 (which has been held at a high value while the gating transistor 160 was in the on state) begins to be discharged. For example, the load 164 may comprise a series of inverters as illustrated in FIG. 10, and elements of the inverters will have portions with a certain amount of capacitance. Other forms of load may be used instead of inverters. The load 164 is coupled to ground and so is gradually discharged by an additional leakage current leaking through the components forming the load 164. The level shifter 170 is provided to toggle each time the charge on the load 164 goes beyond the threshold value, thus ensuring that a signal of an high or low value, not an intermediate value, is propagated through into the next inverting stage.

With the inverter stage 150 of FIG. 10, the propagation delay through the stage 150 is longer than that of the inverter stage 60 of FIG. 3 (provided both inverter stages are formed of transistors switching at the same rate). This is because two capacitive elements are charged and discharged in series and so the time for the signal to pass through the stage is dependent on both the leakage current through the leakage transistor 156 and the leakage current from the load 164 to the ground. The second capacitive element (e.g. the load 164) can be considered as a delaying element. Therefore the oscillation can be slowed down. This can be useful in certain embodiments, for example where fast switching components are used, since in such cases it can help to ensure that the oscillation period is in a measurable range. When slower switching components are used then the oscillation period of inverter stage 60 of FIG. 3 may be sufficient.

Although a p-type leakage embodiment has been illustrated in FIG. 10, an n-type leakage embodiment operating on a similar principle to FIG. 10 can also be developed. Also, while two capacitive elements have been linked together to be successively charged or discharged, alternatively three or more capacitive elements could be arranged so that each capacitive element begins charging or discharging when a previous capacitive element has reached a threshold charge level, with the output of the inverting stage 150 switching once the last of the series of capacitive elements has reached its threshold charge level.

Figure 11:
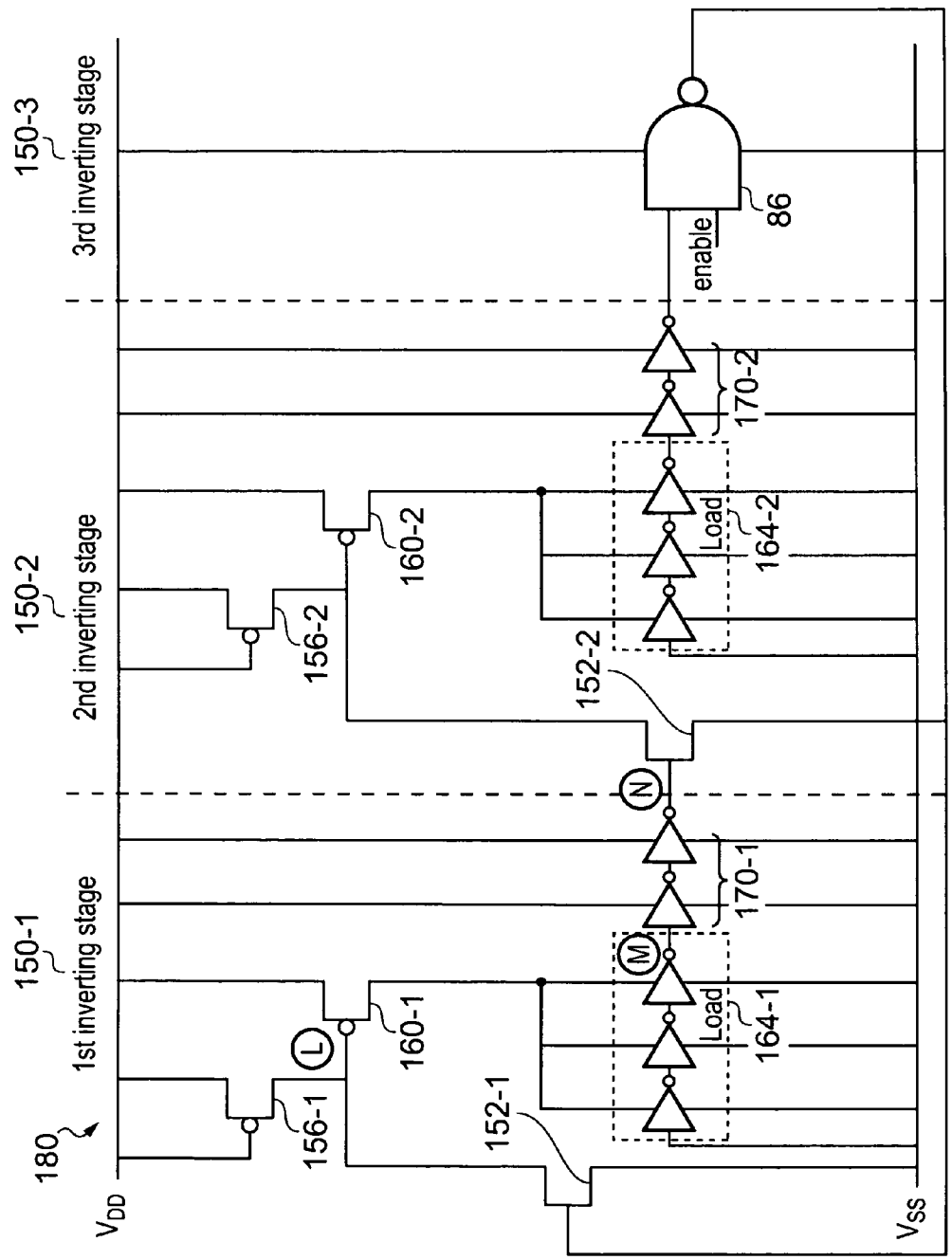
FIG. 11 illustrates a ring oscillator circuit including a number of inverting stages of the type shown in FIG. 10.

FIG. 11 shows an example of the inverter stage 150 used as part of a ring oscillator circuit 180. In this example, the ring oscillator circuit 180 is formed of two inverter stages 150-1, 150-2 formed as in FIG. 10, and a third inverter stage 150-3 having the NAND gate 86. In the example of FIG. 11, the load 164 is again shown as a number of inverters (note that any number of inverters may be used as the load 164). An oscillating signal propagates through the system with a waveform illustrated in FIG. 12. Waveforms L, M and N illustrate the form of the signals at the corresponding points marked in FIG. 11.

Figure 12:
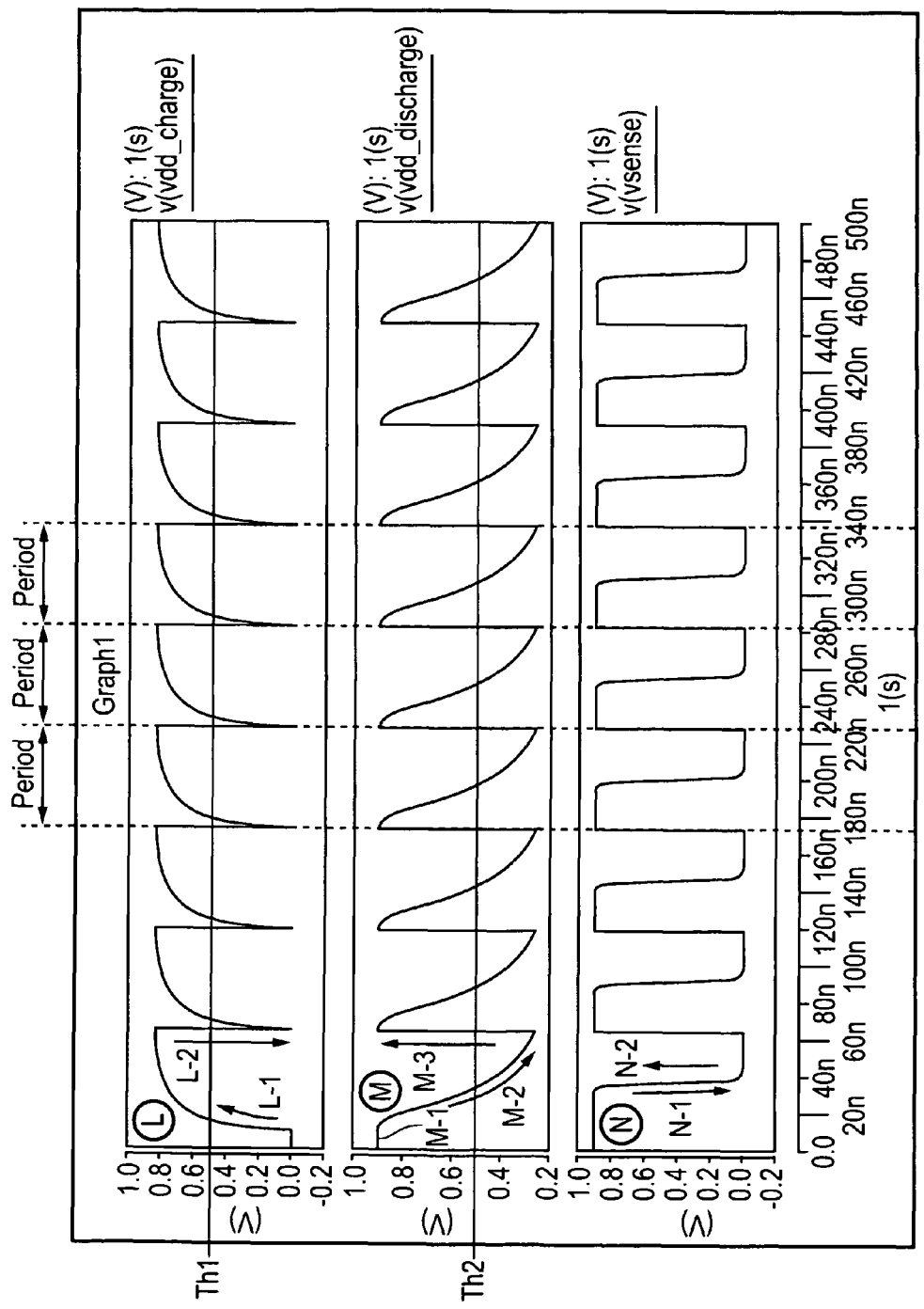
FIG. 12 illustrates a waveform diagram showing the relative timings and profiles of oscillating signals at various points of the circuit shown in FIG. 11.

When the pull-down transistor 152-1 is switched off, the first capacitive element is charged with the leakage current through the leakage transistor 156-1 (see L-1 in FIG. 12). Until the first capacitive element in the gating transistor 160-1 reaches a threshold level Th1, the gating transistor 160-1 is kept on and so the second capacitive element is in a charged state (M-1). When the first capacitive element is charged above the threshold level Th1, the gating transistor 160-1 switches off and the second capacitive element (e.g. part of the load 164-1) is gradually discharged to ground (M-2). The output of the inverting stage is switched to a low value when the second capacitive element is discharged below the threshold value Th2 (N-1). The oscillating signal then propagates through the ring oscillator 180, thus causing the pull-down transistor 152-1 to be switched on. This discharges the first capacitive element (L-2), switches the gating transistor 160-1 on and hence charges the second capacitive element (M-3). This causes the stage output to be set to a high value (N-2).

The second inverting stage 150-2 operates in the same way as the first inverting stage 150-1. The cycle iterates so as to produce an oscillating signal with the period shown in FIG. 12, which can be measured and used as an indication of the operating parameter.

Note that, while additional delay elements have been added to the inverting stages 150-1, 150-2 of the ring oscillator circuit 180 of FIG. 11 compared to the inverting stages 82-1, 82-2 of the ring oscillator circuit 80 of FIG. 4, the oscillation period in the example of FIG. 12 is about 50 ns, shorter than a period of about 2 µs as shown in the example of FIG. 5. This is because the simulated results shown in FIGS. 5 and 12 were calculated for different technology libraries. The FIG. 5 shows an example simulation result for a 32 nm low power process where leakage is low and so the oscillation period is relatively large, while FIG. 12 shows an example simulation result for a 40 nm general purpose process where leakage is relatively large and so the oscillation period is relatively short in comparison to that of FIG. 5. The extra delaying elements provided by the load 164-1, 164-2 can be useful in high leakage systems such as the general purpose process, in order to increase the oscillation period so that it is in a measurable range.

In the above embodiments, the capacitive elements have been formed as part of buffers, inverters, or transistors. However, it would be appreciated that a dedicated capacitor could also be provided. Also, in practice any circuit element has a finite amount of capacitance, and so the capacitive element is in reality not formed by any one element and is in fact distributed among different elements of the circuit.

In each of the ring oscillator embodiments described so far, the monitoring circuit may comprise a measuring circuit for measuring the oscillation period of the signal generated by the ring oscillator and a calibrating circuit for calibrating the monitoring circuit measurements. For example, in FIG. 6 the measuring/calibrating circuit 200 may be provided for measuring the signal at the point between the buffer 70-2 and the NAND gate 86 and calibrating the system to enable correlation between a period and an operating parameter value. The measuring part of circuit 200 may for example comprise a counter.

Alternatively, in any of the embodiments described so far a measuring circuit may be provided externally from the monitoring circuit, as part of the integrated circuit 2 being monitored. For example, the microprocessor 6 may perform the measurement calculations. The microprocessor 6 may also include calibrating circuitry for performing a calibration operation so that a measured oscillation period value can be correlated with the value of the temperature or supply voltage being measured.

Figure 13:
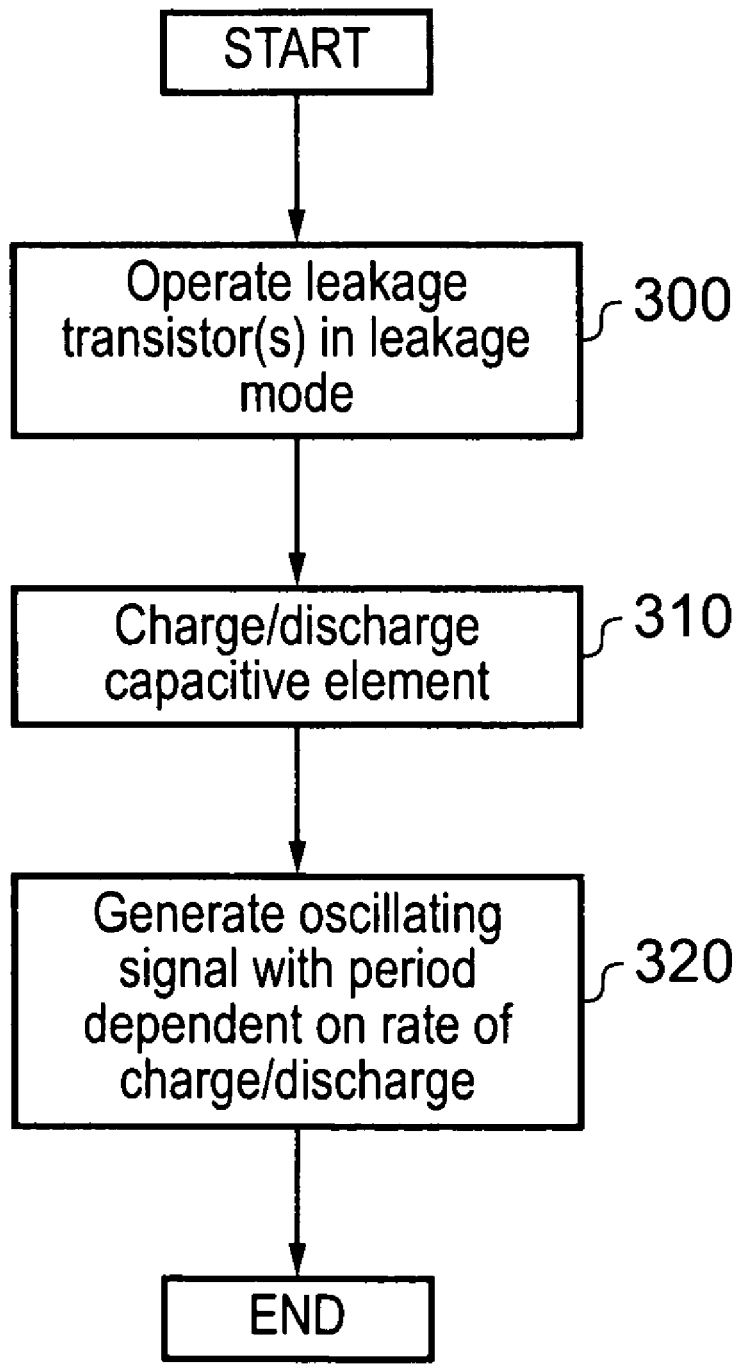
FIG. 13 illustrates a method of monitoring an operating parameter of an integrated circuit.

FIG. 13 illustrates a method of monitoring an operating parameter of an integrate circuit. At step 300, the leakage transistor is operated in a leakage mode in which most of the current passing through the leakage transistor is a leakage current. For example, this can be done by providing an appropriate gate-source voltage difference to the leakage transistor. Then, at step 310, the capacitive element (or in the examples shown in FIGS. 9 and 11, capacitive elements) are charged or discharged with the leakage current. While most of the above described embodiments charge the capacitive elements in dependence on the leakage current, circuit configurations can also be devised in which the leakage current discharges the capacitive element. At step 320 the ring oscillator 80, 100, 120, 140, 180 generates an oscillating signal with a period dependent on the rate at which the capacitive element is charged or discharged. This rate of charge or discharge is dependent on the leakage current and so the oscillation period is an indicator of the operating parameter.

Figure 14:
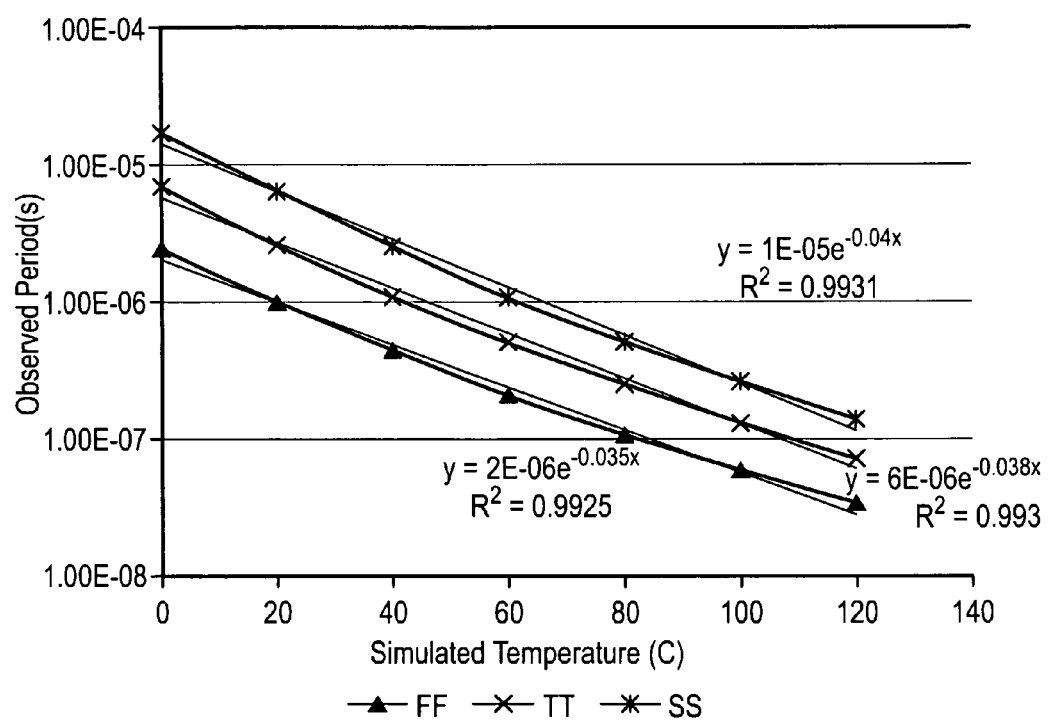
FIG. 14 illustrates a relationship between a measured oscillation period and a temperature.

FIG. 14 shows an example of how the period measured using the ring oscillator circuit depends on the temperature. The leakage current scales exponentially with temperature and so a logarithm of the measured oscillation period scales linearly with temperature, as shown in the graph of FIG. 14. The relationship between temperature (T) and oscillation period (D) is of the form $D=A*\exp(B*T)$. However, the exact relationship depends on the process corner type of the integrated circuit 2 being monitored (see FIG. 14, which shows simulation results obtained for FF, TT, and SS corners). This means that in order to calculate absolute temperature values, one should determine the specific period-temperature relationship for the corner type present on the integrated circuit 2. This can be done by calibrating the monitoring circuit. We can see from FIG. 14 that B (the gradient when ln(D) is plotted against temperature T) is substantially the same for each corner type. This means that a constant value of B can be assumed and so all that is required for calibration is to find a value of the multiplying coefficient A.

Figure 15:
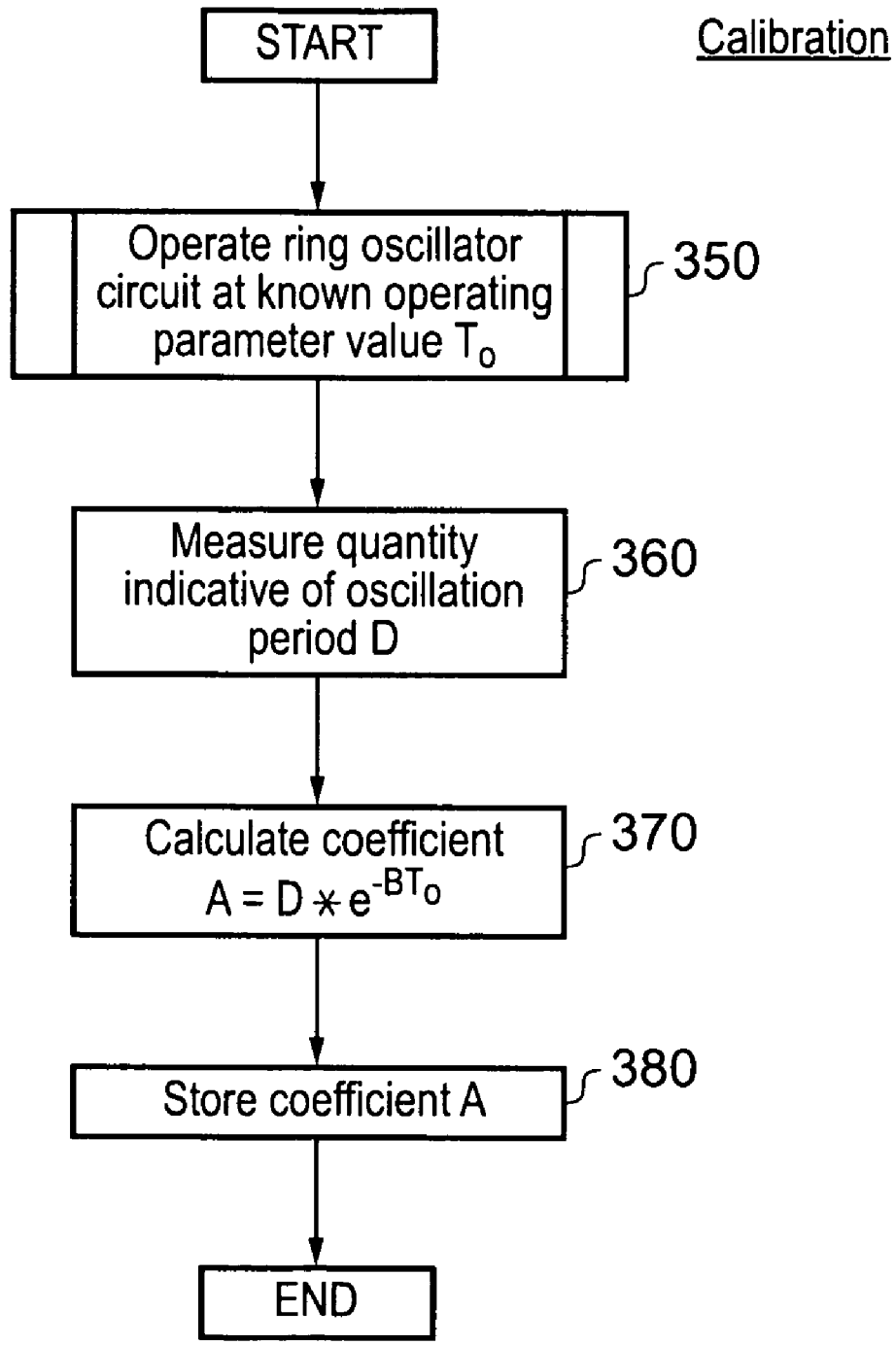
FIG. 15 illustrates a method of calibrating the monitoring circuit.

FIG. 15 illustrates a method of calibrating the monitoring circuit including a ring oscillator as shown in any of the above example embodiments. At step 350, the ring oscillator is operated in accordance with the method of FIG. 13 at a known operating parameter value $T_0$. At step 360 a quantity indicative of the oscillation period D is measured. This quantity may be, for example, the oscillation period itself measured in seconds, or may instead be an indication of the oscillation frequency. At step 370, the calibration coefficient A is then calculated using the equation $A=D*\exp(-B*T_0)$, where B is the gradient value assumed to be constant for all corner types. If a quantity other than the oscillation period has been measured at step 360, then that quantity should be converted into an oscillation period D before being used in the equation at step 370. Finally, at step 380, the calculated calibration coefficient A is stored for use when making measurements. For example, a register or memory provided on the integrated circuit 2 may store the calibration coefficient A.

Figure 16:
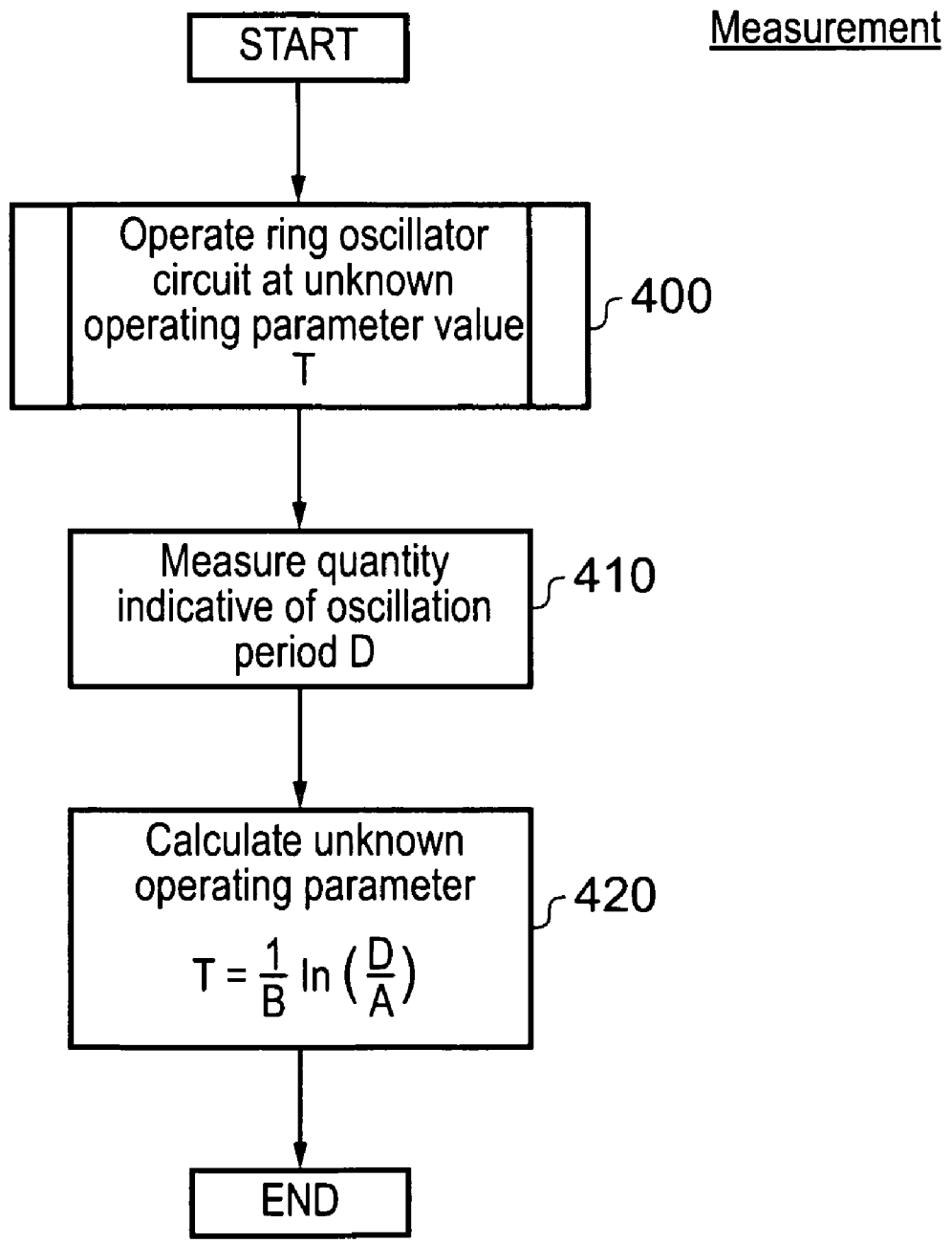
FIG. 16 illustrates a method of determining a value of an unknown operating parameter using the monitoring circuit.

FIG. 16 shows a method of measuring a operating parameter using a monitoring circuit comprising a ring oscillator circuit according to one of the preceding embodiments. At step 400, the ring oscillator circuit is operated at a unknown operating parameter value T, using the method of FIG. 13. While the ring oscillator circuit is operating at the unknown operating parameter value, the quantity indicative of the oscillation period D is measured. At step 420 the period D is used to calculate the unknown operating parameter T using the formula $T=1/B*\ln(D/A)$, where B is the gradient value assumed to be constant for all silicon corner types, and A is the corner-dependent calibration coefficient which was determined during calibration. Thus, the value T is an estimate of the current operating parameter of the ring oscillator circuit and so can be correlated with an unknown operating parameter of nearby portions of the integrated circuit 2 on which the ring oscillator circuit is based. Where a quantity other than the period D is measured, the quantity should be converted into the period D in order to be used in the above formula.

The equations used to calculate the correlation coefficient A in step 370 of FIG. 15 and the unknown parameter T in step 420 of FIG. 16 are merely an example, and other forms of equation can be used. However, the exponential relationship between period and operating parameter should be maintained.

Figure 17:
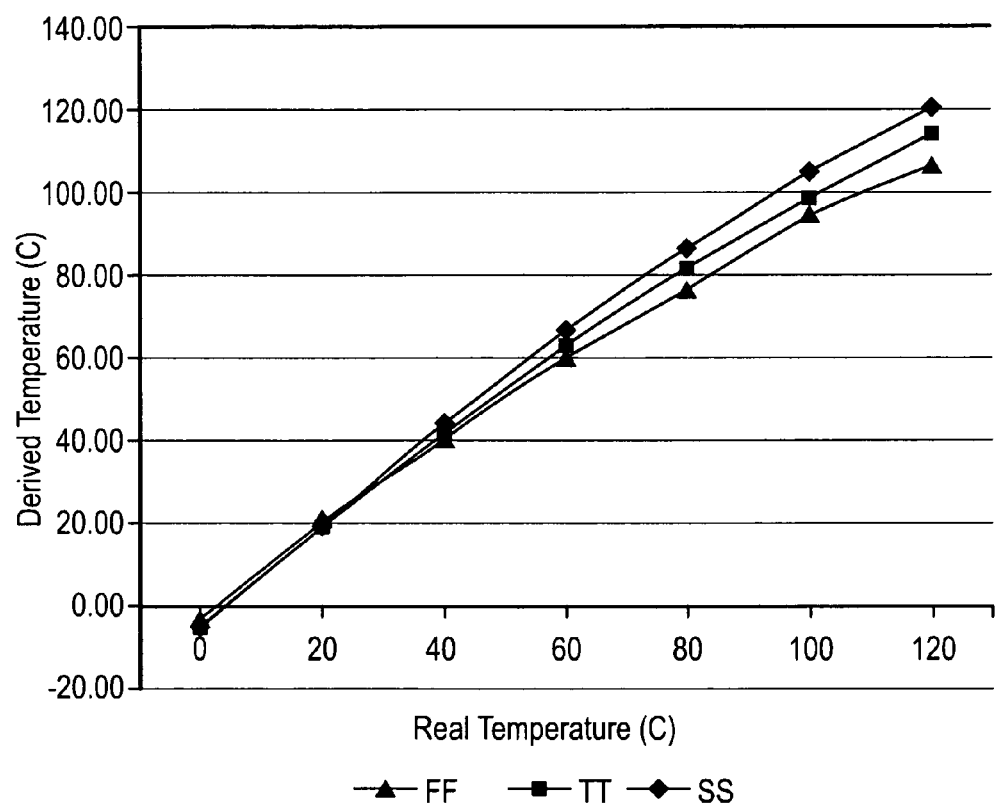
FIG. 17 illustrates a relationship between a real temperature of a monitoring circuit and a measured temperature obtained using the calibrated monitoring circuit.

FIG. 17 shows results of a simulation of the monitoring circuit of the present technique. The relationship between the actual temperature and the temperature measured by the monitoring circuit is illustrated, assuming that the monitoring circuit has been calibrated at 20° C. Simulated results are shown at intervals of 20° C. for SS, TT and FF corner types. The results for different corner types diverge as the temperature gets further away from 20° C. However, this divergence can be addressed by performing the calibration operation shown in FIG. 15 in order to determine which period-temperature relationship is most appropriate for a particular monitoring circuit.

Also, FIG. 15 shows that the temperature derived from the monitoring circuit departs somewhat from the real temperature as the temperatures get further away from the calibration point of 20° C. However, the derived temperature is accurate enough to provide a useful measurement. The worst-case error in FIG. 15 is ±7° C. For a small, low-cost and low-power monitoring circuit such as the ring oscillators described above, the accuracy is acceptable. In any case, the accuracy is reduced only at a temperature relatively far away from the calibration point. If for a particular monitoring circuit the range of 100-120° C. was of interest then the calibration point could be changed to somewhere between 100 and 120° C., thus improving the accuracy of measurements in the range of interest.

The operating parameter measurement provided by the monitoring circuit can be used in several ways. For example, the monitoring circuit 14, 16, 18, 20, 22 in FIG. 1 can be used to control thermal throttling in which the power to certain areas of the integrated circuit 2 is cut off if those areas become too hot. This prevents chips melting in the event of thermal runaway.

Also, the monitoring circuits 14, 16, 18, 20, 22 can be used to control power gating of areas of the integrated circuit in order to place certain portions of the integrated circuit 2 in a power saving state. This is useful because the effectiveness of such power gating is sensitive to temperature and so the monitoring circuits 14, 16, 18, 20, 22 can provide an indication of local temperature at different parts of the integrated circuit 2. The power controller can decide when to place a section of the integrated circuit 22 into a power saving state using the monitored operating parameter, for example weighing up the processing cost associated with the time required to wake up a portion of the integrated circuit 2 from the power saving state with the power savings that can be achieved from placing the portion in the power saving state. Since leakage current (and hence power consumption) scales exponentially with temperature, the cost analysis functions of the power controller can be arranged to favour placing hotter portions of the integrated circuit 2 into a low power state over colder portions.

Figure 18:
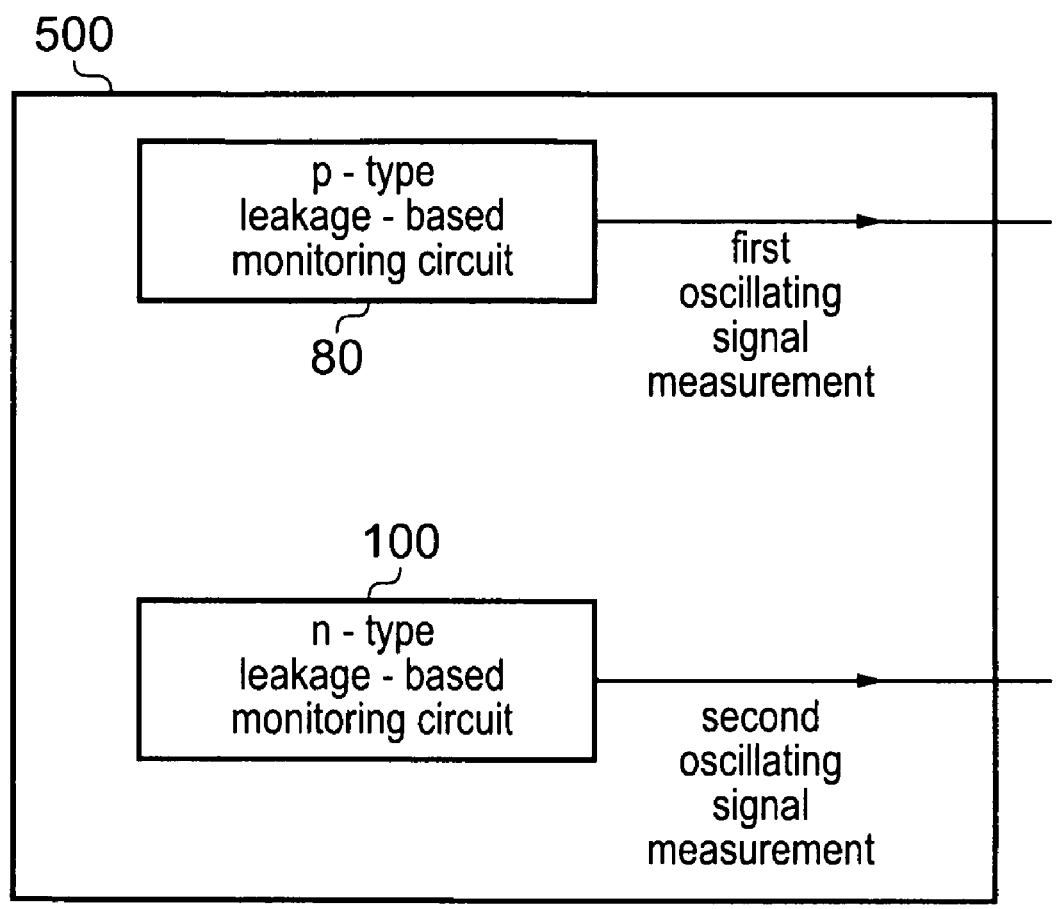
FIG. 18 illustrates a monitoring system comprising a p-type leakage-based ring oscillator circuit and an n-type leakage-based ring oscillator circuit.

FIG. 18 shows a monitoring system 500 comprising a p-type leakage-based monitoring circuit 80 similar to the embodiment shown in FIG. 4 and an n-type leakage based monitoring circuit comprising a ring oscillator circuit 100 according to FIG. 6. Providing such a combined p- and n-type sensor enables a choice between PFET and NFET leakage measurements which can be useful when process corners arise in the integrated circuit 2. Since process corners are unpredictable, providing the combined PFET and NFET system 500 enables a choice to be made between first and second oscillation measurements produced by the different types of ring oscillator. The monitoring system 500 could also be used to identify highly skewed SF or FS corners, since one of these corners can be identified when a significantly different oscillation period is determined using the two types of ring oscillator circuit 80, 100. Alternatively, an average of the oscillating signal period measurements used by the circuit 80 and 100 can be taken in order to provide a measurement which is not based on a particular transistor type. Instead of the ring oscillator circuits 80, 100, respective p- and n-type versions of the ring oscillator embodiments shown in FIG. 7, 9 or 11 could also be combined in a monitoring system 500.

Although a particular embodiment has been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

We claim:

1. A monitoring circuit for monitoring an operating parameter of an integrated circuit, said monitoring circuit comprising:
   a ring oscillator circuit configured to generate an oscillating signal, said ring oscillator circuit comprising a plurality of serially connected inverting stages;
   wherein at least one of said inverting stages comprises:
   (a) at least one leakage transistor configured to operate in a leakage mode in which substantially all current through said at least one leakage transistor is a leakage current; and
   (b) a capacitive element configured to be charged or discharged in dependence on said leakage current, an oscillation period of said oscillating signal being dependent on a rate at which said capacitive element is charged or discharged; and
   said operating parameter controls a magnitude of said leakage current such that said oscillation period is indicative of said operating parameter.

2. The monitoring circuit according to claim 1, wherein said operating parameter is an operating temperature of said at least one leakage transistor.

3. The monitoring circuit according to claim 1, wherein said operating parameter is a supply voltage supplied to said at least one leakage transistor.

4. The monitoring circuit according to claim 1, wherein said at least one leakage transistor comprises at least one p-type transistor coupled between a supply voltage and said capacitive element, said capacitive element being charged in dependence on said leakage current through said at least one p-type transistor.

5. A monitoring circuit according to claim 4, wherein said at least one p-type transistor has its gate coupled to said supply voltage.

6. The monitoring circuit according to claim 4, wherein said at least one inverting stage also comprises at least one pull-down transistor for discharging said capacitive element.

7. The monitoring circuit according to claim 1, wherein said at least one leakage transistor comprises at least one n-type transistor coupled between a ground voltage and said capacitive element, said capacitive element being discharged in dependence on said leakage current through said at least one n-type transistor.

8. The monitoring circuit according to claim 7, wherein said at least one n-type transistor has its gate coupled to said ground voltage.

9. The monitoring circuit according to claim 7, wherein said at least one inverting stage also comprises at least one pull-up transistor for charging said capacitive element.

10. The monitoring circuit according to claim 1, wherein said at least one inverting stage comprises a buffer configured to output an oscillating signal value to a following inverting stage; and said buffer is configured to switch said oscillating signal value between a high value and a low value when said capacitive element is charged or discharged beyond a threshold charge level.

11. The monitoring circuit according to claim 10, wherein at least part of said capacitive element is formed by a part of said buffer.

12. The monitoring circuit according to claim 1, wherein said at least one inverting stage comprises an inverter configured to output an oscillating signal value to a following inverting stage; and said inverter is configured to switch said oscillating signal value between a high value and a low value when said capacitive element is charged or discharged beyond a threshold charge level.

13. The monitoring circuit according to claim 12, wherein at least part of said capacitive element is formed by a part of said inverter.

14. The monitoring circuit according to claim 1, wherein said at least one inverting stage comprises a delaying element for delaying propagation of said oscillating signal through said at least one inverting stage.

15. The monitoring circuit according to claim 1, wherein said capacitive element comprises:
a principal capacitive portion;
at least one additional capacitive portion; and
at least one transmission gate, each transmission gate configured to selectively place a respective additional capacitive portion in an active mode in which said leakage current charges or discharges said respective additional capacitive portion;
wherein a capacitance of said capacitive element is dependent on a number of said at least one additional capacitive portion currently placed in said active mode.

16. The monitoring circuit according to claim 1, wherein said capacitive element comprises:
a first capacitive element configured to be charged or discharged in dependence on said leakage current; and
a second capacitive element configured to be charged or discharged in dependence on an additional leakage current once said first capacitive element has been charged or discharged beyond a threshold charge level; wherein:
said oscillation period is dependent on a rate at which said first capacitive element is charged or discharged and a rate at which said second capacitive element is charged or discharged; and
said operating parameter controls a magnitude of said leakage current and a magnitude of said additional leakage current such that said oscillation period is indicative of said operating parameter.

17. The monitoring circuit according to claim 16, wherein said first capacitive element is charged in dependence on said leakage current, and said second capacitive element is discharged in dependence on said additional leakage current.

18. The monitoring circuit according to claim 16, wherein said first capacitive element comprises a gate interface of a gating transistor, said gating transistor being configured to allow said second capacitive element to be charged or discharged once said gate interface has been charged or discharged beyond said threshold charge level.

19. The monitoring circuit according to claim 18, wherein said second capacitive element comprises at least one inverter.

20. The monitoring circuit according to claim 1, comprising measuring circuitry for measuring said oscillation period of said oscillating signal.

21. The monitoring circuit according to claim 20, comprising calibrating circuitry for performing a calibration operation to enable correlation of a measured oscillation period value with an operating parameter value.

22. An integrated circuit comprising at least one monitoring circuit according to claim 1.

23. A monitoring system for monitoring an operating parameter of an integrated circuit, said monitoring system comprising:
(i) a first ring oscillator circuit configured to generate a first oscillating signal, said first ring oscillator circuit comprising a plurality of serially connected first inverting stages, wherein at least one of said first inverting stages comprises:
(a) at least one p-type leakage transistor configured to operate in a first leakage mode in which substantially all current through said at least one p-type leakage transistor is a first leakage current; and
(b) a first capacitive element configured to be charged in dependence on said first leakage current, a first oscillation period of said first oscillating signal being dependent on a rate at which said first capacitive element is charged; and
(ii) a second ring oscillator circuit configured to generate a second oscillating signal, said second ring oscillator circuit comprising a plurality of serially connected second inverting stages, wherein at least one of said second inverting stages comprises:
(c) at least one n-type leakage transistor configured to operate in a second leakage mode in which substantially all current through said at least one n-type leakage transistor is a second leakage current; and
(d) a second capacitive element configured to be discharged in dependence on said second leakage current, a second oscillation period of said second oscillating signal being dependent on a rate at which said second capacitive element is discharged;
wherein said operating parameter controls a magnitude of said first leakage current and said second leakage current such that said first oscillation period and said second oscillation period are indicative of said operating parameter.

24. A monitoring circuit for monitoring an operating parameter of an integrated circuit, said monitoring circuit comprising:
ring oscillator means for generating an oscillating signal, said ring oscillator means comprising a plurality of serially connected inverting stage means;
wherein at least one of said inverting stage means comprises:
(a) at least one leakage transistor means for operating in a leakage mode in which substantially all current through said at least one leakage transistor means is a leakage current; and
(b) capacitive means for being charged or discharged in dependence on said leakage current, an oscillation period of said oscillating signal being dependent on a rate at which said capacitive means is charged or discharged; and
said operating parameter controls a magnitude of said leakage current such that said oscillation period is indicative of said operating parameter.

25. A method of monitoring an operating parameter of an integrated circuit, said method comprising the steps of:
generating an oscillating signal with a ring oscillator circuit comprising a plurality of serially connected inverting stages, at least one of said inverting stages comprising at least one leakage transistor and a capacitive element;

operating said at least one leakage transistor in a leakage mode in which substantially all current through said at least one leakage transistor is a leakage current; and charging or discharging said capacitive element in dependence on said leakage current, an oscillation period of said oscillating signal being dependent on a rate at which said capacitive element is charged or discharged; wherein said operating parameter controls a magnitude of said leakage current such that said oscillation period is indicative of said operating parameter.

26. A method of calibrating a ring oscillator circuit for monitoring an operating parameter of an integrated circuit, the method comprising the steps of:

performing the method of claim 25 with said ring oscillator circuit operating at a known operating parameter value;

measuring a quantity indicative of said oscillation period;

calculating at least one calibration coefficient in dependence on said quantity measured and said known operating parameter value; and storing said at least one calibration coefficient for use when monitoring an unknown operating parameter value.

27. A method of determining an unknown operating parameter value of an integrated circuit, comprising the steps of:

performing the method of claim 25 with said ring oscillator circuit operating at said unknown operating parameter value;

measuring a quantity indicative of said oscillation period; and calculating said unknown operating parameter value using said quantity and at least one predetermined calibration coefficient.

* * * * *